(12) United States Patent
Aruga et al.

(10) Patent No.: US 7,217,958 B2
(45) Date of Patent: May 15, 2007

(54) FEED THROUGH STRUCTURE FOR OPTICAL SEMICONDUCTOR PACKAGE

(75) Inventors: Hiroshi Aruga, Tokyo (JP); Shinichi Takagi, Tokyo (JP); Kiyohide Sakai, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/542,230

(22) Filed: Oct. 4, 2006

(65) Prior Publication Data

US 2007/0023766 A1 Feb. 1, 2007

Related U.S. Application Data

(63) Continuation of application No. 10/500,573, filed on Jul. 1, 2004, now Pat. No. 7,154,126.

(51) Int. Cl.
*H01L 33/00* (2006.01)

(52) U.S. Cl. .................. 257/98; 257/99; 257/433; 385/88; 385/92; 385/54; 385/58; 385/73; 385/76; 385/100

(58) Field of Classification Search ............. None
See application file for complete search history.

(56) References Cited

U.S. PATENT DOCUMENTS 5,519,720 A 5/1996 Hirano et al.

6,074,102 A 6/2000 Oikawa
2002/0172476 A1 11/2002 Nagase et al.

FOREIGN PATENT DOCUMENTS

| EP | 0 477 801 A1 | 4/1992 |
|---|---|---|
| JP | 6-314857 | 11/1994 |
| JP | 11-233876 | 8/1999 |
| JP | 2000-019473 | 1/2000 |
| JP | 2000-164970 | 6/2000 |

OTHER PUBLICATIONS

K. Sakai et al., "A Coaxial DFB Laser-Diode Module with a Differential Feed for 10-Gb/s Ethernet Applications," Optical Fiber Communication Conference (OFC), Mar. 23-28, 2003, pp. 679-680.

*Primary Examiner*—Evan Pert
*Assistant Examiner*—Tan Tran
(74) *Attorney, Agent, or Firm*—Buchanan Ingersoll & Rooney PC

(57) ABSTRACT

Includes a stem with a hole, a dielectric sealed into the hole of the stem and including a pair of pin insertion holes, and a pair of high frequency signal pins that penetrate and fit into the pair of pin insertion holes of the dielectric, and constituting differential lines connected to an optical semiconductor element.

10 Claims, 16 Drawing Sheets

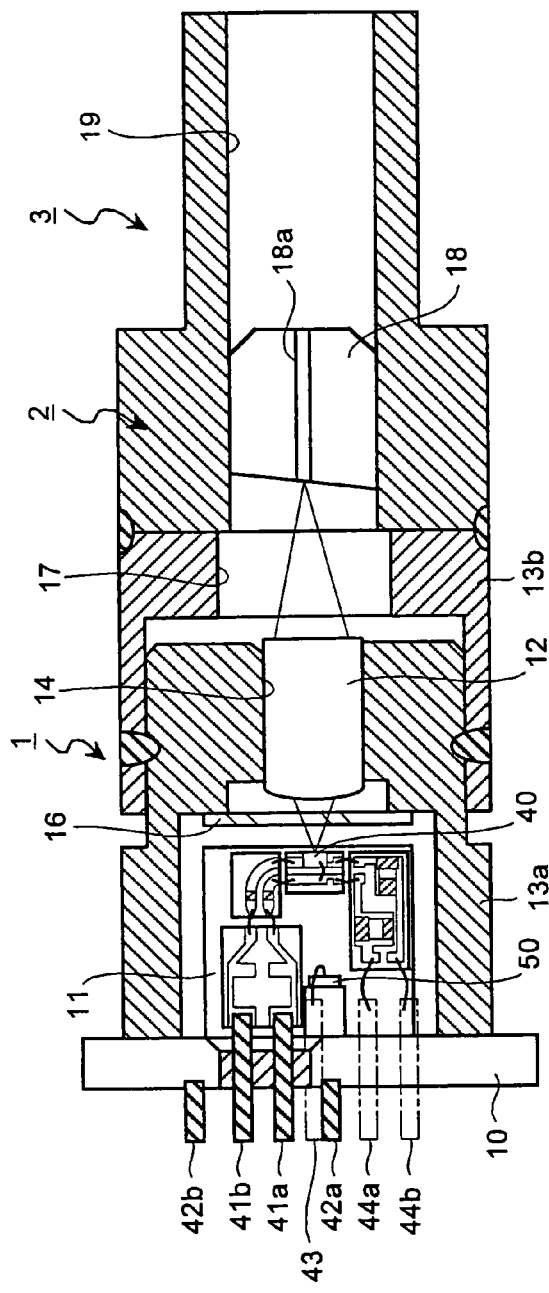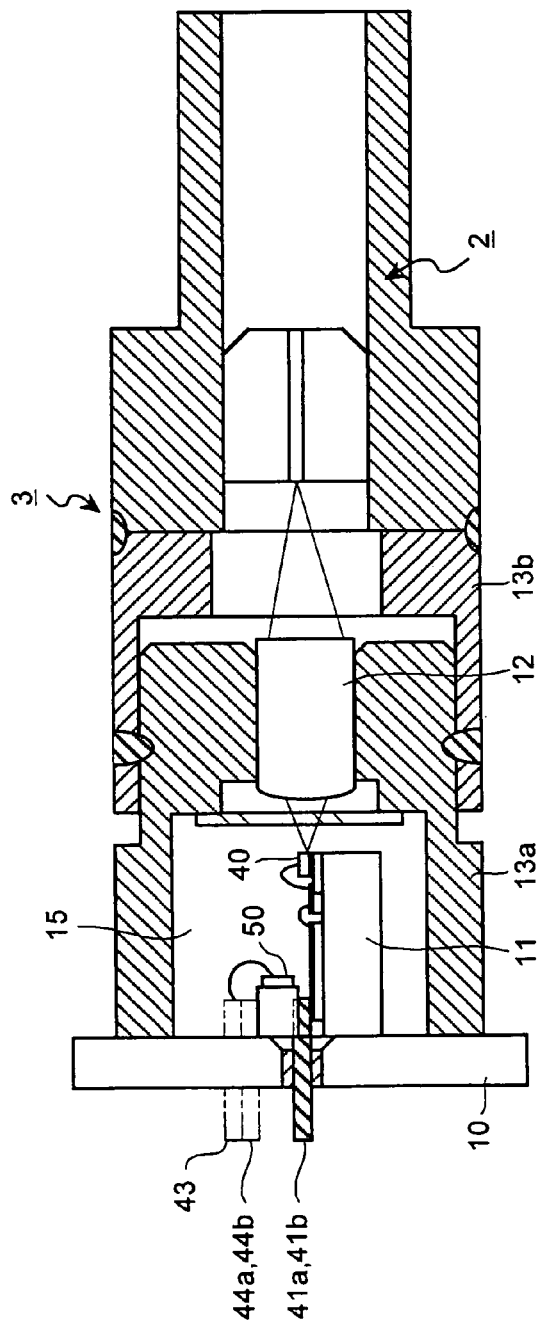
FIG.3A
FIG.3B (a)  (b)

→ SEMICONDUCTOR SUBSTRATE SIDE

FIG.23
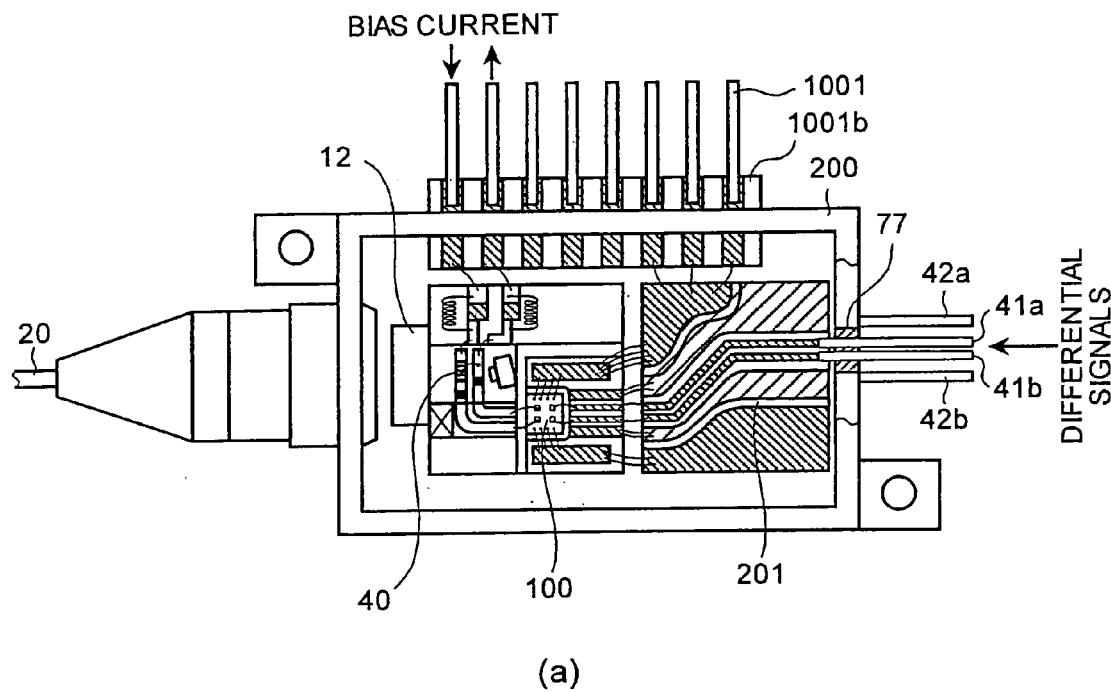
(a)
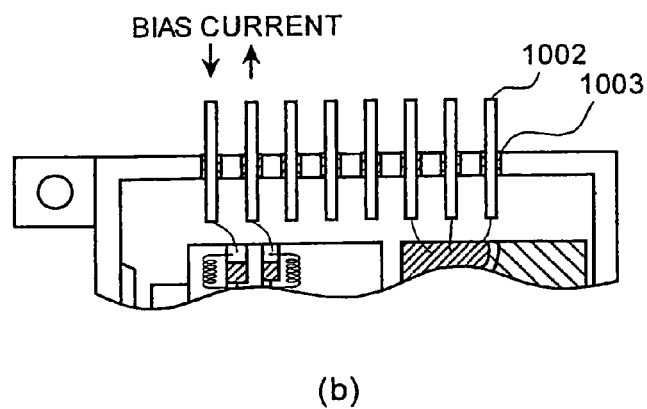
(b)

FEED THROUGH STRUCTURE FOR OPTICAL SEMICONDUCTOR PACKAGE

CROSS REFERENCE OF RELATED APPLICATIONS

This application is a continuation of application Ser. No. 10/500,573, filed Jul. 1, 2004 now U.S. Pat. No. 7,154,126.

TECHNICAL FIELD

The present invention relates to an optical semiconductor package in which an optical semiconductor element such as a semiconductor laser is packaged, and more specifically relates to a coaxial module to which an optical fiber is attached or an optical semiconductor element module to which a receptacle adapter for connecting an optical fiber is attached.

BACKGROUND ART

In recent years, an optical signal transmission rate of an optical communication system that transmits an optical signal through an optical fiber has been rapidly accelerating so as to satisfy an increase in communication traffic as the Internet spreads. Likewise, a transmission rate of an optical transmitter-receiver has shifted from 2.5 Gb/s to 10 Gb/s, and research and development are underway with a view of realizing a transmission rate of 40 Gb/s. Accordingly, there an increasing needs to accelerate a transmission rate of a signal handled by an optical transmitter-receiver.

The optical transmitter-receiver converts a data signal to be transmitted from an electric signal to an optical signal and transmits the optical signal through a transmission optical fiber, on the other hand, receives an optical signal through a reception optical fiber and reproduces the optical signal received as an electric signal.

As an optical semiconductor package employed for the optical transmitter-receiver of this type, there are known can packages, box-like packages and the like. Conventional techniques using the can package are disclosed, for example, in Japanese Patent Application Laid-Open No. H6-314857 and Japanese Patent Application Laid-Open No. H11-233876.

Japanese Patent Application Laid-Open No. H6-314857 discloses a single-phase feed type optical semiconductor module that includes through lead pins sealed with glass. Japanese Patent Application Laid-Open No. H11-233876 discloses a technique for driving a laser diode by providing a pair of distant signal pins sealed with different dielectrics on a metal stem, connecting one of outputs of a differential driver to one of electrodes of the laser diode through one of the signal pins, and connecting the other output of the differential driver to the other electrode of the laser diode through a dummy load and a virtual grounding wire.

The single-phase can packages disclosed by these publications have the following disadvantages. Since they are single-phase can packages, impedance mismatching tends to occur in front and rear portions (portions in which the pins from the dielectric are exposed to an air layer) of a feed-through (a part in which the pins are covered with dielectric) when a modulated signal at 10 Gb/s or more is to be transmitted, and high frequency transmission characteristics of the package become worse. As a result, these single-phase can packages are being used for signal transmission only at up to about 2.5 Gb/s.

The technology disclosed in Japanese Patent Application Laid-Open No. H11-233876 is intended only to ensure stability during a high-rate operation by setting respective load impedances for the differential driver equal, but not to constitute the signal pins and a line from the signal pins to the laser diode into differential lines. In addition, a dummy resistor is disposed outside of the package, so that a signal quality degrades when a modulated signal is transmitted at 10 Gb/s or more. Further, according to this conventional art, a positive-phase differential signal and an antiphase differential signal are not applied to an anode and a cathode of the laser diode, respectively, so that the laser diode is not driven in a differential manner.

Conventional techniques using the box-like package are disclosed, for example, in Japanese Patent Application Laid-Open No. 2000-164970 and Japanese Patent Application Laid-Open No. 2000-19473. Japanese Patent Application Laid-Open No. 2000-164970 includes a discloser about a single-phase feed type box-like package that connects a feed-through of a grounded coplanar substrate to a micro-strip substrate, and a single-phase feed type box-like package that connects a feed-through of a micro-strip substrate to the micro-strip substrate. Japanese Patent Application Laid-Open No. 2000-19473 includes a discloser about a single-phase feed type box-like package that connects a feed-through of a grounded coplanar substrate to a micro-strip substrate, a singe-phase feed type box-like package that connects a feed-through of a grounded coplanar substrate to the grounded coplanar substrate, and a single-phase feed type box-like package that connects a feed-through of a coaxial connector to a micro-strip substrate.

In such box-like packages, a micro-strip line is constituted by a ceramic substrate and a metallic pattern provided on an upper surface of the ceramic substrate, and a feed line can be formed with high accuracy so that an input signal supplied to a laser diode does not deteriorate much. Nevertheless, the box-like package has the following disadvantages. The ceramic substrate itself per unit area is expensive. If the feed-through is to be constituted, it is formed as a multilayer ceramic feed-through. In order to connect the multilayer ceramic feed-through to a lead, a brazing step or the like is necessary and it thereby takes time and labor so that the cost of the package rises. Further, because the ceramic package is used, the size of the package increases.

In the field of optical transmitters-receivers of this type, an optical semiconductor element module capable of realizing optical transmission at 10 Gb/s or more at low cost so as to spread optical communication not only to trunks but also to access systems for office and household purposes is strongly desired.

However, the conventional can package employed for the optical semiconductor element module as disclosed in Japanese Patent Application Laid-Open No. H6-314857 and Japanese Patent Application Laid-Open No. H11-233876 has the following disadvantages. Impedance mismatching tends to occur in front and rear portions of the feed-through and the high frequency characteristics of the package deteriorate. As a result, the can package cannot resist signal transmission at bit rates of 10 Gb/s or more.

In the box-like package employed in the conventional optical semiconductor element module provided with an external terminal made of ceramic as disclosed in Japanese Patent Application Laid-Open No. 2000-164970 and Japanese Patent Application Laid-Open No. 2000-19473, signal transmission at bit rates of 10 Gb/s or more can be realized; however, it has the following disadvantages. The ceramic substrate itself per unit area is expensive. If the feed-through is to be constituted, it is formed as a multilayer ceramic feed-through. In order to connect the multilayer ceramic feed-through to a lead, a brazing step or the like is necessary and it thereby takes time and labor so that the package becomes expensive.

It is an object of the present invention to provide a low cost optical semiconductor package capable of ensuring superior high frequency transmission characteristics, and performing a high-rate operation of 10 Gb/s or more.

DISCLOSURE OF THE INVENTION

An optical semiconductor package according to the present invention is an optical semiconductor package for packaging therein an optical semiconductor element, and includes a stem with a hole; a dielectric sealed into the hole of the dielectric, and with a pair of pin insertion holes; and a pair of high frequency signal pins that penetrate through and fit into the pair of pin insertion holes of the dielectric, and that constitute differential lines electrically connected to the optical semiconductor element.

Furthermore, the dielectric may be glass.

Furthermore, the stem may include a first member arranged on an outside of the dielectric, wherein a coefficient of thermal expansion of the first member is substantially equal to a coefficient of thermal expansion of the dielectric; and a second member arranged on an outside of the first member, wherein a thermal conduction of the second member is higher than that of the first member.

Furthermore, the dielectric may be transparent or semi-transparent.

Furthermore, the hole in the stem may be oval, elliptical, or cocoon shaped.

Furthermore, a ground member in parallel to the pair of high frequency signal pins may be provided on the stem.

Furthermore, the ground member may be a pair of ground pins, and the pair of ground pins may be provided on outer sides of the pair of high frequency signal pins, respectively, so as to put the pair of high frequency signal pins between the pair of ground pins.

Furthermore, the optical semiconductor element may be a semiconductor laser diode including a pair of electrodes, and a differential line substrate having a one end side connected to the pair of high frequency signal pins, and an other end side connected to the pair of electrodes of the optical semiconductor element; and a pair of inductance elements having one end sides connected to the pair of electrodes of the optical semiconductor element, respectively, and having other end sides connected to an external bias current source may be provided additionally.

Furthermore, stubs may be formed on the pair of differential lines on the differential line substrate, respectively.

Furthermore, the stubs may be formed to protrude in a direction in which the respective differential lines are closer to each other.

Furthermore, a cap that includes a light passing hole, and that airtight closes an internal space including the optical semiconductor element by fixing an end portion to the stem may be provided.

An optical semiconductor package according to the next invention is an optical semiconductor package that contains an optical semiconductor element and an integrated circuit which transmits and receives differential signals to and from the optical semiconductor element, the optical semiconductor package includes a dielectric sealed into and fixed to a wall surface of the package, and having a pair of pin insertion holes; and a pair of signal pins that penetrate through and fit into the pair of pin insertion hole, and constituting differential lines, wherein differential signals are transmitted and received to and from the integrated circuit through the pair of signal pins.

BRIEF DESCRIPTION OF THE DRAWINGS

FIG. 3A is a vertical sectional view and FIG. 3B is a horizontal sectional view of the LD module;

FIG. 23 is an illustration for explaining a sixth embodiment of the present invention.

BEST MODE FOR CARRYING OUT THE INVENTION

Exemplary embodiments of an optical semiconductor package according to the present invention will be explained hereinafter in detail with reference to the accompanying drawings. The optical semiconductor package in the embodiments is employed for an optical semiconductor element module applied to, for example, a local area network such as a network for the connection between servers disposed in a building, and that for the connection between servers disposed in different buildings.

First Embodiment

The optical semiconductor package employed in an optical semiconductor module in the first embodiment of the present invention will be explained with reference to FIG. 1 to FIG. 17. The optical semiconductor package in the first embodiment adopts an inexpensive can package type module form, and includes therein a laser diode (hereinafter, "LD") serving as an optical semiconductor element. In this specification, it is assumed that the optical semiconductor package is a generic term embracing even a package without a sealing cap.

Figure 1:
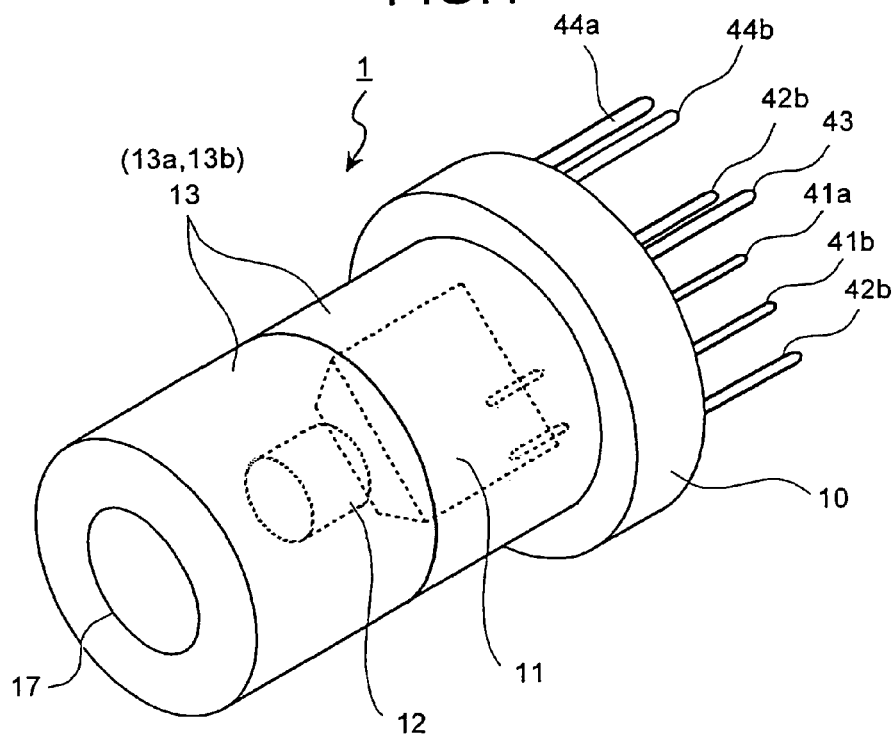
FIG. 1 is a perspective outer view of an optical semiconductor package according to the present invention.
Figure 2:
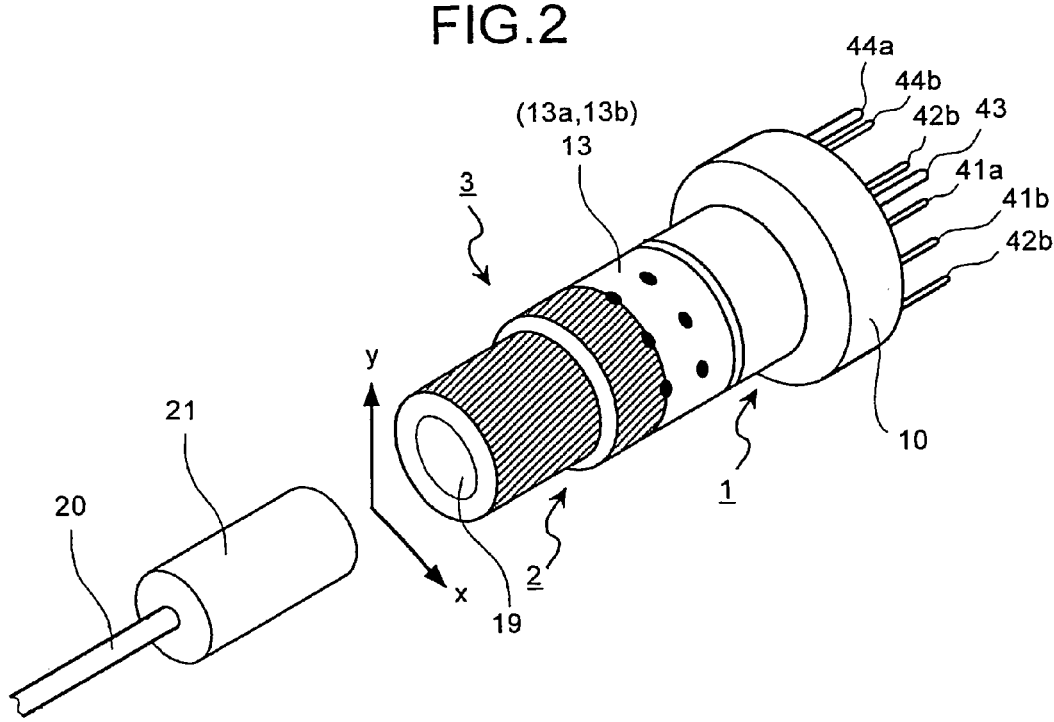
FIG. 2 is a perspective outer view of an LD module in which the optical semiconductor package according to the present invention is connected to a receptacle.

FIG. 1 is an outer perspective view of the optical semiconductor package (hereinafter, "can package") 1. FIG. 2 is an outer perspective of the optical semiconductor element module 3 (hereinafter, "LD module" since an example of packaging an LD in the package will be mainly explained in this embodiment) including the can package 1 and a receptacle 2. FIG. 3A is a horizontal sectional view (a view in a direction parallel to an x axis shown in FIG. 2) and FIG. 3B is a vertical sectional view (a view in a direction parallel to a y axis in FIG. 2).

As shown in FIG. 1, FIG. 2, and FIGS. 3A and 3B, the can package 1 includes a disk-like stem 10 on which bias feed pins, high frequency pins, and the like are mounted, a pedestal 11 of a trapezoidal cylinder shape (a pedestal block) on which a plurality of ceramic substrates are mounted, a condenser lens 12 which condenses a laser light emitted from an LD 40, a cylindrical cap 13 which seals the pedestal 11 and the like from the outside, etc.

As shown in FIGS. 3A and 3B, the cap 13 has a double cylinder form which includes a first cap member 13a fixed to the stem 10 by projection welding or the like and a second cap member 13b fitted into a tip end side of the first cap member 13a from outward and fixed to the first cap member 13a by Yttrium Aluminum Garnet laser welding (hereinafter, "YAG welding") or the like. Specifically, the first cap member 13a includes stepped outer cylinders, and the outer cylinder having a smaller diameter is provided on the tip end of the outer cylinder having a larger diameter. An inner cylinder of the one end-side second cap member 13b is fitted into the outer periphery of the outer cylinder having the smaller diameter, and the first cap member 13a is fixed to the second cap member 13b by through YAG welding.

On the tip end side of the first cap member 13a, a lens insertion hole 14 is formed and the condenser lens 12 is inserted into the hole 14. The condenser lens 12 is fixed to the first cap member 13a by a screw, an adhesive material, or the like. An internal space 15 of the first cap member 13a is isolated from the outside by a glass window 16, whereby the internal space 15 in which the pedestal 11 is contained is kept airtight. If the internal space 15 can be kept airtight by bonding or soldering the condenser lens 12 to the hole 14 of the cap 13, the window 16 maybe omitted.

In a portion (the other end side) of the second cap member 13b opposed to the condenser lens 12, a hole 17 for causing the laser light to pass through is formed. By sliding the second cap member 13b relative to the first cap member 13a, making an adjustment relative to a laser light axis direction, and fixing the second cap member 13b to the first cap member 13a by the YAG welding, the condenser lens 12 and a dummy ferrule 18 held in the receptacle 2 are aligned to each other in the laser light axis direction.

The receptacle 2 includes a ferrule insertion hole 19 for inserting a ferrule 21 (see FIG. 2) to which an optical fiber 20 is connected. The dummy ferrule 18, in which an optical fiber 18a is arranged, is press-fitted and fixed into a can package 1 side of the ferrule insertion hole 19. One end face of the receptacle 2 on the side, on which the dummy ferrule 18 is fixed, is fixed to an end face on the other end side of the second cap member 13b in the can package 1 by butt welding using YAG welding or the like. By making a positioning adjustment relative to two directions vertical to the laser light axis direction with their respective coupled faces abutted on each other when fixing the receptacle 2 to the second cap member 13b, the condenser lens 12 is aligned to the dummy ferrule 18 in the receptacle 2 relative to the two directions at right angles with respect to the laser light axis.

A ferrule 21, to which an optical fiber 20 is connected, includes an appropriate mechanism (not shown) for pressing the ferrule 21 toward the dummy ferrule 18 and locking the ferrule 21 to the receptacle 2 when the ferrule 21 is inserted into the ferrule insertion hole 19 of the receptacle 2. Therefore, if the ferrule 21 is inserted into the ferrule insertion hole 19 of the receptacle 2, an end face of the optical fiber 18a in the dummy ferrule 18 abuts on an end face of the optical fiber 20 in the ferrule 21, whereby the fibers are connected (optically coupled) to each other.

The internal configuration of the can package 1 will next be explained. Before explaining the internal configuration of the can package 1, an equivalent circuit for the respective constituent elements of the can package 1 will be explained with reference to FIG. 4.

Figure 4:
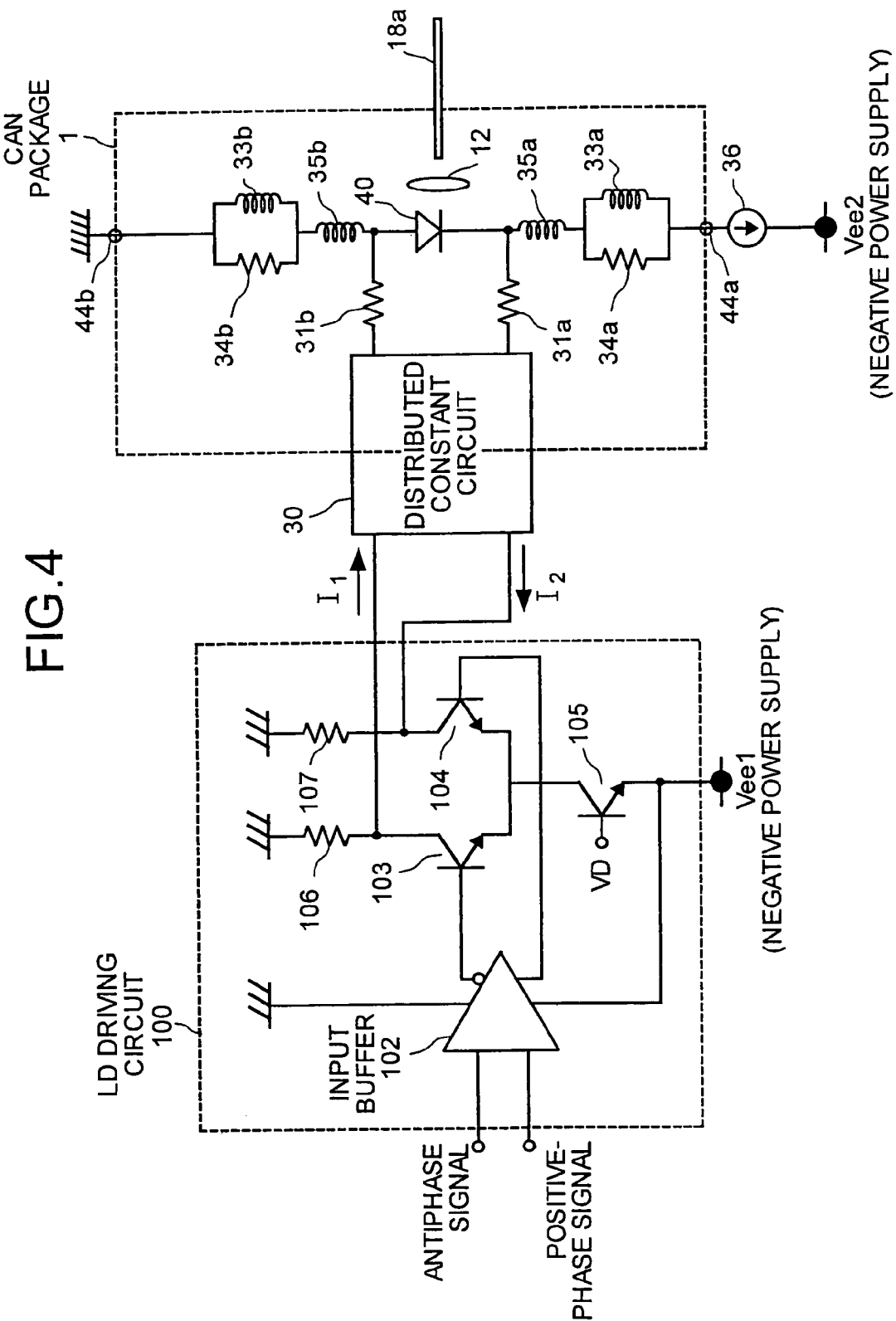
FIG. 4 is an equivalent circuit diagram for constituent elements of a can package and an LD driving circuit.

FIG. 4 is a circuit block diagram illustrating one example of the circuit configuration of the respective constituent elements in the can package 1 and that of an LD driving circuit 100 that drives the LD 40 in the can package 1. The LD driving circuit 100 is mounted on an external substrate electrically connected to the can package 1. A grounded coplanar differential line 70 (see FIG. 5 and FIG. 6) is provided on the external substrate.

The LD driving circuit 100 includes an input buffer 102 which has a differential input configuration, a pair of differential transistors 103 and 104 which have differential configuration and which output a positive-phase signal and an antiphase signal, respectively, a transistor 105 which serves as a bias constant-current source, and resistors 106 and 107 which make impedance matching.

The input buffer 102 shapes waveforms of input positive-phase signal and antiphase signal, and outputs the shaped positive-phase signal and antiphase signal to bases of the differential transistors 103 and 104, respectively.

The paired differential transistors 103 and 104 that have the differential configuration constitute a differential amplifier. Collector sides of the differential transistors 103 and 104 are connected to the resistors 106 and 107, respectively. The other sides of the resistors 106 and 107 are connected to ground terminals, respectively. Emitters of the transistors 103 and 104 are connected to a collector of the transistor 105 as the constant-current source. The base of the transistor 103 is connected to an antiphase signal output terminal of the input buffer 102, and the base of the transistor 104 is connected to a positive phase signal output terminal of the input buffer 102. Namely, the transistor 104, to which a positive phase input, converts a positive-phase signal $I_2$ to a current determined by the transistor 105 and outputs the current, and the transistor 103, to which an antiphase is input, converts an antiphase signal $I_1$ to the current determined by the transistor 105 and outputs the current. An emitter side of the transistor 105 is connected to a negative power supply Vee1.

Emitter-side output terminals of the transistors 103 and 104 are connected to a pair of electrodes (a cathode and an anode) of the LD 40 through a distributed constant circuit 30, which includes micro-strip lines, grounded coplanar lines, high frequency signal pins to be explained later, or the like, and matching resistors 31a and 31b, respectively.

The can package 1 includes a distributed constant circuit 30, impedance matching resistors 31a and 31b of about 20 ohms, the LD 40 having a high frequency impedance of about 5 ohms, air-cored solenoids 33a and 33b having high frequency impedances and serving as inductance elements, resonance prevention resistors 34a and 34b connected in parallel to the air-cored solenoids 33a and 33b, respectively, and wire bonds 35a and 35b that connect the LD 40 to the air-cored solenoids 33a and 33b, respectively.

A cathode-side of the LD 40 is connected to one end of a bias constant-current source 36 through the wire bond 35a, and a parallel circuit of the air-cored solenoid 33a connected to the wire bond 35a in series and the resonance prevention resistor 34a. The other end of the bias constant-current source 36 is connected to a negative power supply Vee2. An anode-side of the LD 40 is grounded through the wire bond 35b, and a parallel circuit of the air-cored solenoid 33b connected to the wire bond 35b in series and the resonance prevention resistor 34b. The air-cored solenoids 33a and 33b are electrically connected to the paired electrodes of the LD 40 at closer sides to the LD 40 than the matching resistors 31a and 31b, respectively. While the negative power supplies Vee1 and Vee2 are preferably the same, but they may be different.

According to the driving configuration of the LD 40, the cathode and anode of the LD 40 are connected to the bias power supply (the bias constant-current source 36 and ground terminal in FIG. 4) through the solenoids 33a and 33b, and high frequency modulated signals are input to the cathode and anode of the LD 40 by the differential paired transistors 103 and 104.

Namely, if a state of the differential transistor 104 in the LD driving circuit 100 changes from OFF to ON (a state of the differential transistor 103 changes from ON to OFF), a current flows in the LD 40 and a state of an laser light output from the LD 40 changes from OFF to ON. If the state of the differential transistor 104 changes from ON to OFF (the state of the differential transistor 103 changes from OFF to ON), the current flowing in the LD 40 decreases and the state of a laser light output of the LD 40 changes from ON to OFF.

Accordingly, the modulated electrical signals output from the differential transistors 103 and 104 in the LD driving circuit 100 are transmitted to the LD 40 through the distributed constant circuit 30 and the like, and converted to modulated optical signal in the LD 40. The modulated optical signals generated from the LD 40 are condensed on the optical fiber 18a by the condenser lens 12 and the condensed, modulated optical signal is output through the optical fiber 18a.

Figure 5:
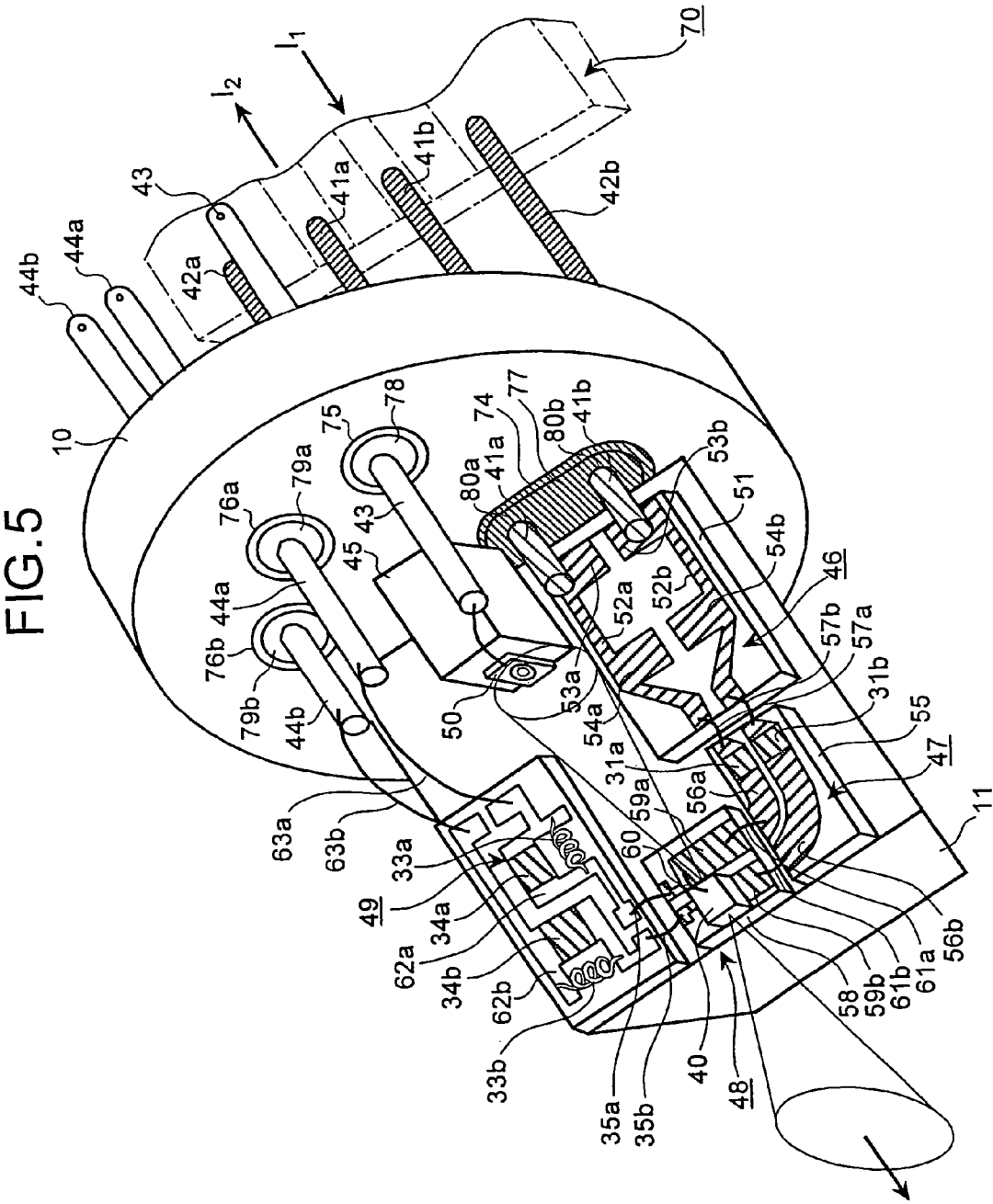
FIG. 5 is a perspective view of an internal configuration of the can package in according to a first embodiment.
Figure 6:
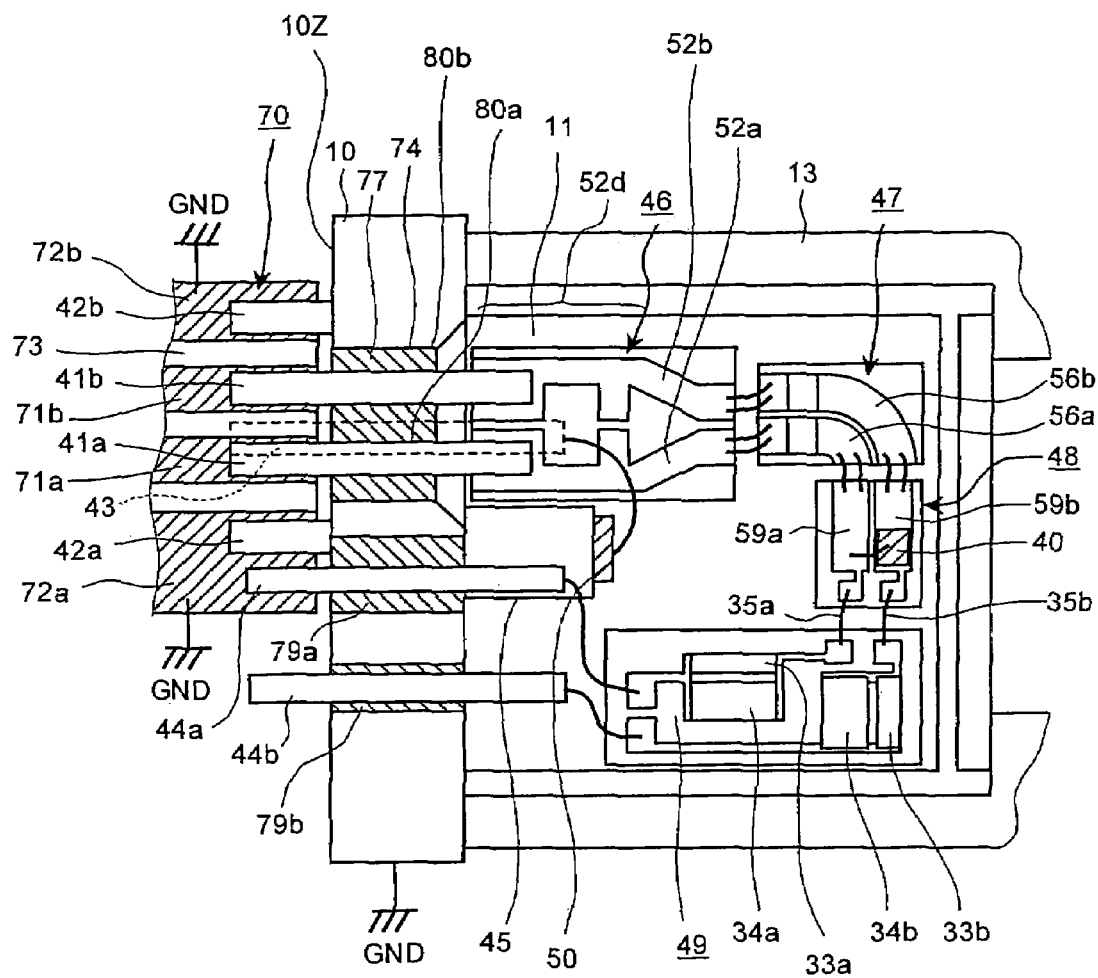
FIG. 6 is a plane view of the internal configuration of the can package in the first embodiment.
Figure 7:
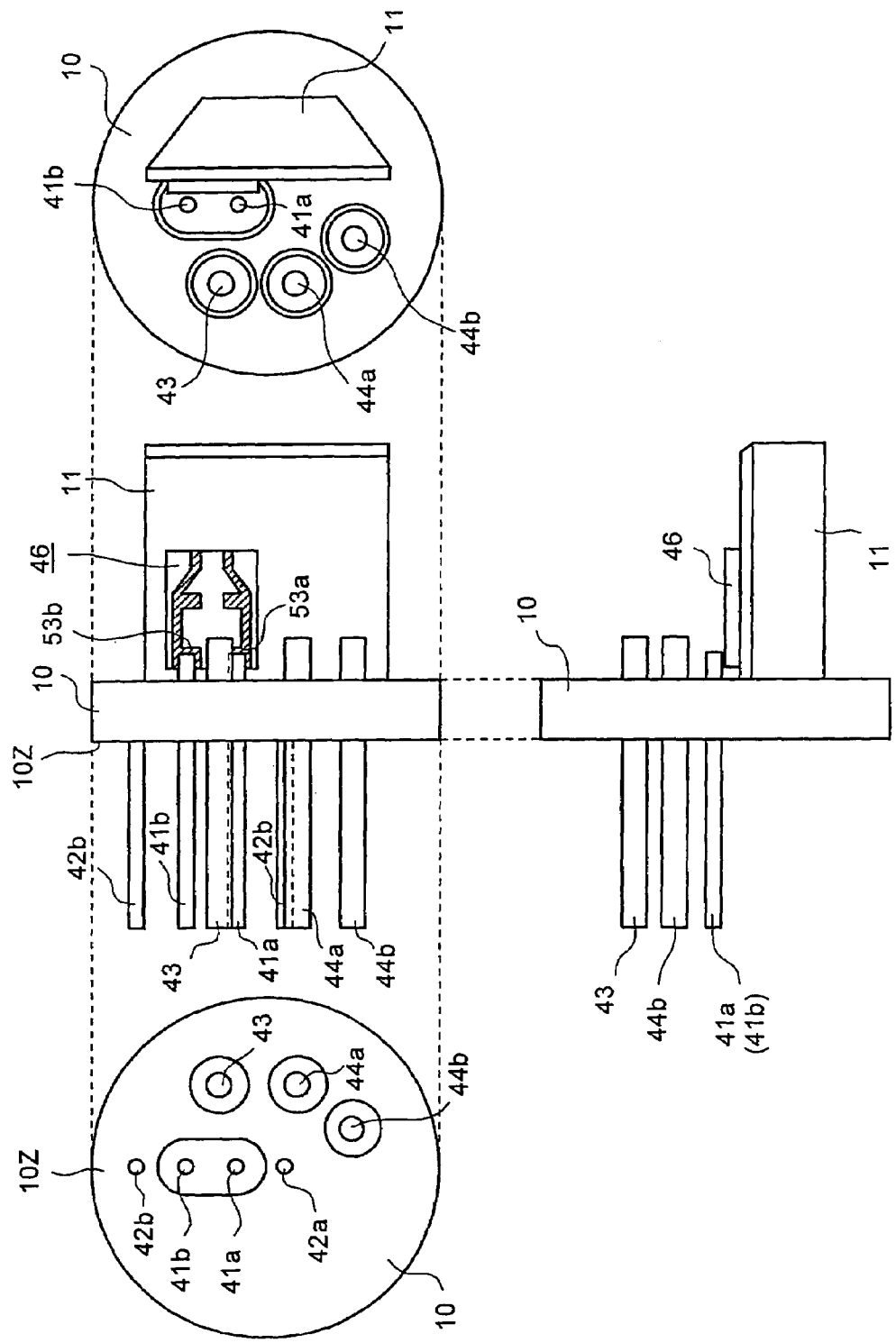
FIG. 7 illustrates a positional relationship among a stem, pins, and a pedestal.
Figure 8:
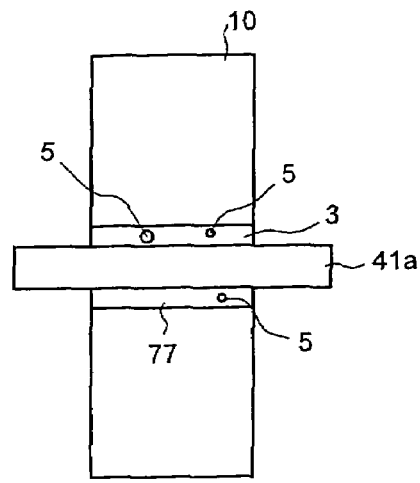
FIG. 8 illustrates bubbles generated in a dielectric.
Figure 9:
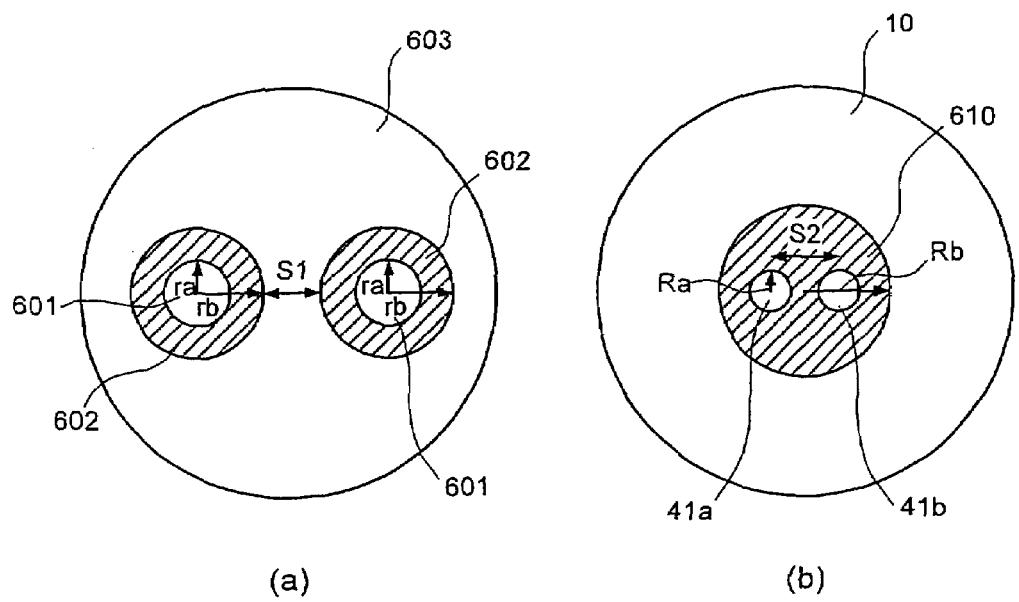
FIG. 9 typically illustrates a cross section of a conventional feed-through and that of a feed-through in the first embodiment.

The internal configuration of the can package 1 will next be explained with reference to FIG. 5 to FIG. 7. FIG. 5 is a perspective view illustrating the can package 1 in a state in which the cap 13 is detached. FIG. 6 is a plane view of the can package 1. FIG. 7 illustrates the arrangement relationship and the like among the stem, the pins, and the pedestal. For convenience of explanation, FIG. 6 slightly differs from FIGS. 3A and 3B, FIG. 5, and FIG. 7 in positions at which the bias feed pins 44a and 44b, the monitor signal pin 43, and the like are arranged.

As shown in FIG. 5 to FIG. 7, the can package 1 includes the disk-like stem 10 on which a plurality of pins are mounted and the trapezoidal cylinder-shaped pedestal 11 vertically fixed to an inner wall surface of the stem 10 by Ag brazing or the like.

On the stem 10 which constitutes a ground, a pair of high frequency signal pins 41a and 41b to which the differential modulated electric signals (hereinafter, also referred to as "differential high frequency signals") are transmitted from the LD driving circuit 100, two ground pins 42a and 42b arranged on both sides of these high frequency signal pins 41a and 41b, one monitor signal pin 43 for transmitting a signal of a monitoring light reception element (e.g., a photodiode, (hereinafter, "PD")) 50, a pair of bias feed pins 44a and 44b for supplying bias currents from an external DC bias current source to the LD 40, and a PD chip carrier 45 are mounted. For example, if a positive-phase current signal $I_2$ shown in FIG. 4 is extracted from the high frequency signal pin 41a, a current $I_1$ opposite in phase to the current signal $I_2$ shown in FIG. 4 is applied to the high frequency signal pin 41b.

Among these signal pins, the high frequency signal pins 41a and 41b and the ground pins 42a and 42b constitute a feed-through for causing an electric signal to pass through via the stem 10 while being kept airtight. The respective pins are fixed to the stem 10 through dielectrics made of such a material as glass in an airtight sealed state. The ground pins 42a and 42b are fixedly attached to an outer wall surface of the stem 10 that constitutes the ground by press-fitting or welding. The PD 50 mounted on the PD chip carrier 45 is intended to monitor a monitor light emitted from the LD 40 toward a backward direction.

Micro-strip differential line substrates 46 and 47, an LD chip carrier 48, and a bias circuit substrate 49 are mounted on an upper surface of the pedestal 11. Overall surfaces of the pedestal 11 and the stem 10 are plated with a conductive material. A plane conductor plate (hereinafter, "solid ground") that is formed on rear surfaces of the micro-strip differential line substrates 46 and 47 and the LD chip carrier 48 and that serves as a ground conductor layer is soldered and electrically connected to the upper surface of the pedestal 11. In addition, the pedestal 11 acts as a radiation path for radiating a heat generated from the LD 40 or the like.

The micro-strip differential line substrate 46 includes a ceramic substrate 51, a pair of strip differential signal lines 52a and 52b formed on an upper surface of the ceramic substrate 51, and the solid ground (not shown) formed on the rear surface of the ceramic substrate 51. Pads 53a and 53a to contact with the high frequency signal pins 41a and 41b protruding from the stem 10 are formed on one-end sides of the strip differential signal lines 52a and 52b, respectively. Stubs 54a and 54b which protrude to be closer to each other signal line, which have low characteristic impedances, and which function as capacitances, are formed halfway along the strip differential signal lines 52a and 52b, respectively. The strip differential signal lines 52a and 52b are set to have a larger distance therebetween in input-side portions 52d (FIG. 6) near the stem 10 so as to increase characteristic impedances for making impedance matching of the strip differential signal lines 52a and 52b with the high frequency signal pins 41 a and 41b, respectively. The strip differential signal lines 52a and 52b each include a portion in which the distance between the signal lines is gradually smaller and an output-side portion in which the distance between the signal lines is smaller and in which the signal lines are arranged in parallel. End portions of the high frequency signal pins 41a and 41b mounted on the stem 10 are connected and fixed to the pads 53a and 53b of the micro-strip differential line substrate 46 by brazing or soldering as shown in FIG. 7.

The micro-strip differential line substrate 47 includes a ceramic substrate 55, a pair of strip differential signal lines 56a and 56b formed on an upper surface of the ceramic substrate 55, and the solid ground (not shown) formed on a rear surface of the ceramic substrate 55. Each of the strip differential signal lines 56a and 56b includes a corner curve portion for turning up a signal line direction by about 90 degrees. The matching resistors 31a and 31b (see FIG. 4) for impedance matching are formed halfway along the strip differential signal lines 56a and 56b, respectively. The strip differential signal lines 52a and 52b are connected to the strip differential signal lines 56a and 56b by wire bonds 57a and 57b, respectively.

The LD chip carrier 48 includes micro-strip differential lines including a ceramic substrate 58, a pair of strip differential signal lines 59a and 59b formed on an upper surface of the ceramic substrate 58, and the solid ground (not shown) formed on a rear surface of the ceramic substrate 58. The LD 40 is mounted on the one strip differential signal line 59b so that the anode that is one of the electrodes of the LD 40 directly abuts on one end thereof. The cathode that serves as the other electrode of the LD 40 is connected to the other strip differential signal line 59a by the wire bond 60. The strip differential signal lines 56a and 56b are connected to the other ends of the strip differential signal lines 59a and 59b by wire bonds 61 a and 61b, respectively. The ceramic substrate 58 is made of a material having good thermal conductivity such as aluminum nitride (AlN) or silicon carbide (SiC). As the LD 40, a distributed feedback laser diode element capable of modulation at 10 Gb/s, for example, is employed.

Two wiring patterns 62a and 62b and a pair of inductance circuits (parallel circuits each including of the inductance element and the resistor) are formed on the bias circuit (ceramic) substrate 49. The air-cored solenoid 33a and the resonance prevention resistor 34a that prevents a resonance between an inter-line capacitance of the air-cored solenoid 33a and the inductance are arranged to be electrically connected to each other in parallel on the one wiring pattern 62a. Likewise, the air-cored solenoid 33b and the resonance prevention resistor 34b are arranged to be electrically connected to each other in parallel on the other wiring pattern 62b. The solenoids 33a and 33b are arranged to be away from each other so that (extension lines of) central axes of the solenoids 33a and 33b cross each other, preferably orthogonal to each other to prevent the solenoids 33a and 33b from interfering with each other magnetic field. One end portion of the wiring pattern 62a and that of the wiring pattern 62b are connected to the strip differential signal lines 56a and 56b on the LD chip carrier 48 through wire bonds 35a and 35b, respectively. The other end portion of the wiring pattern 62a and that of the wiring pattern 62b are connected to the bias feed pins 44a and 44b provided on the stem 10 through wire bonds 63a and 63b, respectively.

The characteristic configuration of each section in the can package 1 will be explained in more detail. The configuration of the stem 10 will first be explained.

As shown in FIG. 5 and FIG. 6, the differential high frequency signals output from the differential transistors 103 and 104 in the LD driving circuit 100 shown in FIG. 4 are input to the can package 1 through a grounded coplanar differential line 70 provided on a substrate arranged outside of the can package 1. The grounded coplanar differential line 70 includes a pair of differential signal lines 71a and 71b formed on a substrate, grounds 72a and 72b arranged outside of the differential signal lines 71a and 71b to put the paired differential signal lines 71a and 71b therebetween, and the solid ground (not shown) arranged on a rear surface of the line 70 and connected to the grounds 72a and 72b.

The differential signal lines 71a and 71b of the grounded coplanar differential line 70 are connected to and fixed to the high frequency signal pins 41a and 41b provided on stem 10. The ground lines 72a and 72b of the grounded coplanar differential line 70 are connected to and fixed to the ground pins 42a and 42b provided on the stem 10.

The stem 10 consists of metal such as Fe—Ni alloy (Kovar), soft iron, or copper-tungsten (CuW), and an upper layer of the stem 10 is normally plated with Ni, gold or the like for soldering. For example, the stem 10 consisting of Kovar or soft iron can be formed by blanking a metallic plate by a mold, or the stem 10 consisting of CuW can be formed by metal injection mold. Since the stem 10 can be easily manufactured, a cost of the stem 10 is low. A plurality of holes 74, 75, 76a, and 76b are formed to be distributed on the stem 10, and dielectrics 77, 78, 79a, and 79b are inserted into the respective holes 74, 75, 76a, and 76b.

A pair of pin insertion holes 80a and 80b are formed in the dielectric 77, and the high frequency signal pines 41a and 41b are inserted into and fixed to the pin insertion holes 80a and 80 b, respectively. Likewise, holes (reference symbols of which are not shown) are formed in the dielectrics 78, 79a, and 79b, and the monitor signal pin 43 and the bias feed pins 44a and 44b are inserted into and fixed to the holes, respectively. The dielectric 77 into which the paired high frequency signal pines 41a and 41b are inserted is oval in this example. Accordingly, the hole 74 into which the dielectric 77 is inserted is oval. The other dielectric 78, 79a, and 79b are circular. It is noted that the ground pins 42a and 42b are not penetrated through the stem 10 but are fixedly attached to an outer wall surface 10z (FIG. 6 and FIG. 7) of the stem 10 by press-fitting and welding.

Lengths of portions of the two high frequency signal pins 41a and 41b which protrude toward at least one outside of the dielectric 77 (protruding lengths toward the LD 40 side) are set smaller than those of the monitor signal pin 43 and the bias feed pins 44a and 44b in light of high frequency characteristics. By so setting, the signals transmitted over the high frequency signal pins 41a and 41b can be promptly transferred to the strip differential signal lines 52a and 52b on the micro-strip differential line substrate 46 when the signals are out of the dielectric 77. Since the monitor signal pins 43 and the bias feed pins 44a and 44b have no strict restrictions for the high frequency characteristics, the protruding lengths are secured to some extent, thereby facilitating wire bond connection operation and the like.

As a material for the dielectrics 77, 78, 79a, and 79b, soda-barium glass, for example, is preferably used or borosilicate glass may be used. The soda-barium glass has a dielectric constant $\epsilon r$ of 4 to 5. As a material for the high frequency signal pins 41a and 41b, the monitor signal pin 43, the bias feed pins 44a and 44b, and the ground pins 42a and 42b, metal such as Kovar or 50-percent Ni—Fe alloy is used.

If the high frequency signal pins 41a and 41b, the monitor signal pin 43, the bias feed pins 44a and 44b, and the dielectrics 77, 78, 79a, and 79b are inserted into and fixed to the stem 10, a vibration is applied while mounting the dielectrics 77, 78, 79a, and 79b on the stem 10 in which the dielectric insertion holes 74, 75, 76a, and 76b are formed.

The dielectrics 77, 78, 79a, 79b are thereby dropped into the holes 74, 75, 76a, and 76b. Likewise, the pins 41a, 41b, 43, 44a, and 44b are dropped into the holes 80a, 80b, and the like formed in the dielectrics 77, 78, 79a, and 79b. In this state, a plurality of stems 10 are inserted into a carbon tool, not shown, and then heated at one burst in an electric furnace, thereby temporarily melting the dielectrics and fixing the dielectrics and pins to the stem 10.

If the stem 10 and the pedestal 11 are manufactured separately, the pedestal 11 is connected and fixed to the stem 10 by Ag brazing or the like. Needless to say, the stem 10 and the pedestal 11 may be manufactured integrally.

In this connection, it is assumed that the two metallic pins are not fixed to the oval dielectric 77 but fixed by the fusion of glass beads to constitute the feed lines. If so, as can be seen in an example of high frequency coaxial connectors, the pins exhibit good performance as long as they are manufactured under sufficient manufacturing management. However, since the glass beads are molten and solidified, such things occur that the shape of the glass tend to be irregular when the glass filled into the pin through holes is solidified, the pins fall, the positions at which the pins are connected to the respective feed lines in the module tend to be not uniform. For these reasons, impedance mismatching often occurs. As a result, problems including a problem that a jitter occurs to a signal waveform input to the LD 40 to thereby deteriorate an optical output waveform, often arise.

Materials for the stem 10, the signal pins 41a and 41b, . . . , the dielectrics 77 and 78, . . . , and the pedestal 11 will next be considered. The selection of the materials therefore depends on what characteristics are to be optimized.

(1) To Prevent Cracks Occurring to the Dielectric (glass)

In order to ensure the impedance matching and the reliability of the airtight structure, it is necessary that the dielectric 77 sealed with the high frequency signal pins 41a and 41b is thick. In addition, as the material for the dielectric 77, such glass as soda-barium glass or borosilicate glass is used. Therefore, coefficients of thermal expansion of the pins and the stem 10 arranged inside and outside of the glass are set substantially equal to that of the glass so as not to generate cracks in the glass in a temperature change of −40° C. to 85° C. required as communication equipment environmental temperatures. Thus, Kovar is used as the material for the pins, and Kovar or CuW is used as the material for the stem 10.

(2) To Optimize Radiation Characteristics

In order to optimize the radiation characteristics for the heat generated from the LD 40 or the like, it is optimal that the stem 10 and the pedestal 11 are formed out of CuW integrally with each other. By using the metal injection mold technique, a complicated shape such as an integral structure of the stem 10 and the pedestal 11 can be created at a relatively low cost. Soda-barium glass, borosilicate glass, or the like is used for the dielectric, and Kovar is used for the pins.

(3) To Reduce Cost

In order to reduce cost, it is optimal that the stem 10 and the pedestal 11 are formed out of Kovar integrally with each other. However, since Kovar is inferior in radiation characteristics, Kovar can be used only for a package for the optical semiconductor element that has low heat emission. For the LD module as explained in this embodiment, Kovar can be used since the heat emission of the LD module is as low as about 0.2 watts. For the PD module to which a trans-impedance amplifier is attached, the heat emission of the amplifier is about 0.5 watts and temperature rise is great. Therefore, it is difficult to use Kovar for the PD module.

(4) Compromise

CuW having good radiation characteristics may be used for the pedestal 11 that supports heat emission sources, and inexpensive Kovar may be used for the stem 10. The pedestal 11 is coupled to the stem 10 by brazing. Alternatively, inexpensive iron may used for the pedestal 11 and the pedestal 11 may be coupled to the stem 10 consisting of Kovar by brazing.

It is noted that the grounded coplanar differential line 70, the high frequency signal pins 41a and 41b, the ground pins 42a and 42b, the stem 10, the wire bonds 57a and 57b, the micro-strip differential line substrate 46, and the like constitute the distributed constant circuit 30.

As a material for the oval dielectric 77 through which the high frequency signal pins 41a and 41b are penetrated, a transparent or semitransparent glass material is used. By using such a glass material, it is possible to easily, visually inspect bubbles 5 (see FIG. 8) that deteriorate reflection characteristics for the high frequency signals and that are generated in the glass material. As the glass used for the dielectric of this type, black glass is conventionally used. If the black glass is used, it is difficult to visually inspect the bubbles 5 generated in the glass. Needless to say, the black glass may be used for the monitor signal pins 43 and the bias feed pins 44a and 44b other than the high frequency signal pins 41a and 41b.

The configuration for making impedance matching between the differential signal lines will be explained.

The conventional can package that employs the single-phase line is inexpensive but has a problem of insufficient high frequency characteristics. FIG. 9(a) typically illustrates a cross section of a feed-through in the conventional package that employs the signal pins for the single-phase line as disclosed by Japanese Patent Application Laid-Open No. H11-233876 or the like. In FIG. 9(a), a dielectric (glass) 602 having a radius of rb is filled on an outer periphery of each metallic signal pin 601 having a radius of ra, an outer periphery of each dielectric 602 is surrounded by a metallic stem 603, and the feed-through is thereby constituted. The stem 603 is grounded.

Figure 10A:
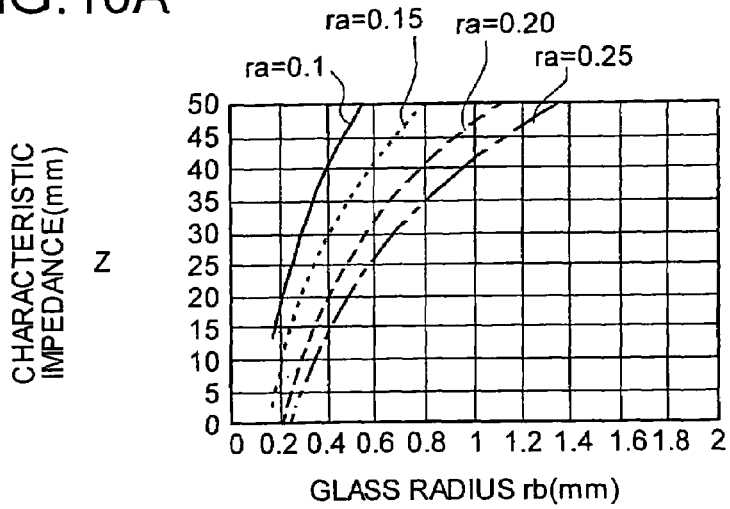
FIGS. 10A to 10C illustrate relationships between a glass radius and a characteristic impedance for the conventional feed-through and that for the feed-through in the first embodiment.

The characteristic impedance of such a signal pin 601 is represented by the following equation (1). FIG. 10A illustrates the characteristic impedance of the feed-through for the signal pins of the single-phase feed-through shown in FIG. 9(a) if the dielectric (glass) has a dielectric constant εs of 4.1 and a relative permeability μs of 1, and the radius ra of the signal pin 601 is 0.1 millimeter, 0.15 millimeter, 0.2 millimeter, and 0.25 millimeter.

$$Z = \frac{377}{2\pi} \sqrt{\frac{\mu_s}{\varepsilon_s}} \ln\left(\frac{r_b}{r_a}\right) \quad (1)$$

As shown in FIG. 10A, if the radius ra of the signal pin is, for example, 0.15 millimeter, it is necessary to constitute the feed-through using the dielectric (glass) having the radius rb of 0.4 millimeter so that the feed-through has a characteristic impedance of 30 ohms. If two feed-throughs are aligned on the stem and a distance S1 of 0.5 millimeter is kept between the two feed-throughs, a length of the feed-throughs that occupies a diameter direction of the signal pin is 2.1 millimeters. With this configuration, the feed-through occupies half (or more than half) of the ordinary can package having a diameter of 5.4 millimeters (or 3.5 millimeters).

Further, the conventional can package that employs the single-phase signal line has the following problems. The characteristic impedance changes greatly as the radius of the dielectric 602 (a diameter of a hole in the stem 603 filled with the dielectric 602) changes. In working, when the hole diameter slightly differs or pin attachment positions are deviated, the characteristic impedance greatly varies. In addition, a portion of this feed-through in which the feed-through is connected to the circuit substrate, the strip line, or the like from an outlet of the feed-through has a rapid increase in characteristic impedance, and electric reflection tends to occur to the portion. Thus, the variation of the characteristic impedance makes it difficult to design and manufacture the matching circuit.

FIG. 9(b) typically illustrates a cross section of the feed-through provided in the can package 1 in the first embodiment of the present invention and including the high frequency pins 41a and 41b. In FIG. 9(b), radius of each of the high frequency signal pins 41a and 41b is at Ra, a distance between centers of the high frequency signal pins 41 a and 41b is S2, a dielectric (glass) 610 (corresponding to the dielectric 77 shown in FIG. 5) having a radius of Rb is provided on outer peripheries of the high frequency signal pins 41a and 41b, and the stem 10 is arranged outside of the dielectric 610. For brevity of explanation, the dielectric 610 of a circular shape is shown in FIG. 9(b). The stem 10 is grounded.

Figure 10B:
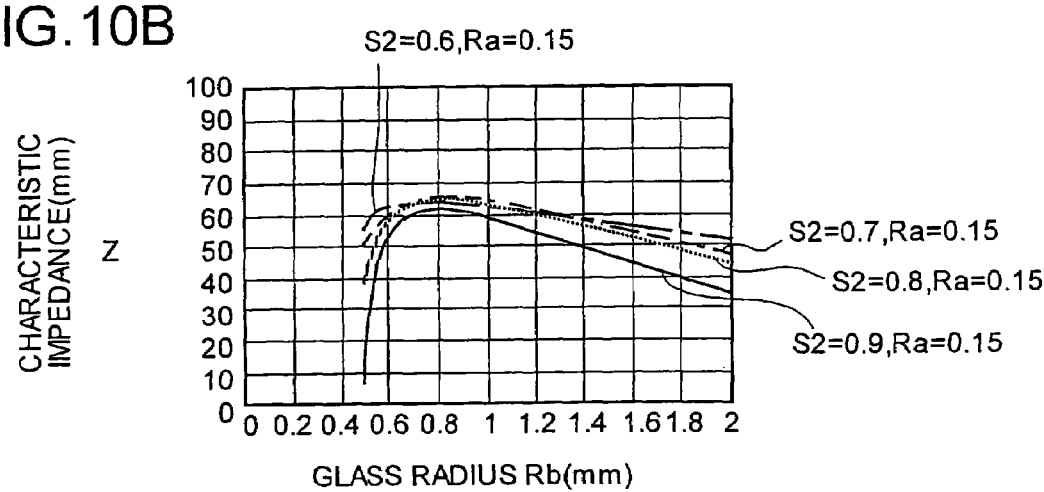

The characteristic impedance of the feed-through shown in FIG. 9(b) is expressed by the following equation (2). It is noted that Equations (1) and (2) are based on the description of Yoshihiro Konishi: Basics and Applications of Microwave Circuit, first edition, page 16, by Sogo Electronics Press, Aug. 20, 1990. FIG. 10B illustrates the characteristics impedance of the feed-through for the differential lines if radius Ra of each of the high frequency signal pins 41a and 41b is 0.15 millimeters, the distance S2 between the centers of the pins 41a and 41b is 0.6 to 0.9 millimeter (0.6 millimeter, 0.7 millimeter, 0.8 millimeter, and 0.9 millimeter), the dielectric constant $\epsilon_s$ of the dielectric (glass) is 4.1, and the relative permeability $\mu_s$ of the dielectric (glass) is 1. With the radius Ra of each of the high frequency signal pins 41a and 41b being, for example, 0.15 millimeter, even if the central distance S2 varies from 0.7 millimeter to 0.9 millimeter and the radius of the dielectric (glass) 610 varies in a range from 0.65 millimeter to 1.1 millimeters, the characteristic impedance is in a range of 60 to 65 ohms and a variation in the characteristic impedance is small.

$$Z = \frac{377}{\pi} \sqrt{\frac{\mu_s}{\varepsilon_s}} \ln\left(\frac{S_2}{R_a} \cdot \frac{(R_b)^2 - (S_2)^2}{(R_b)^2 + (S_2)^2}\right) \quad (2)$$

In equation (2), Z is in ohms; however, the equation is simplified under conditions of Rb>Ra and S2>2 Ra.

Figure 19A:
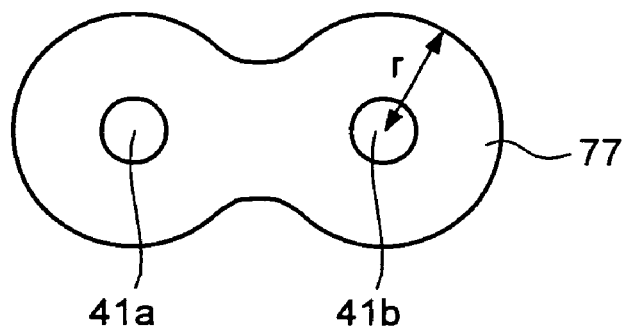
FIGS. 19A to 19C are illustrations for explaining a second embodiment of the present invention, and illustrates another shape of the dielectric.
Figure 19B:
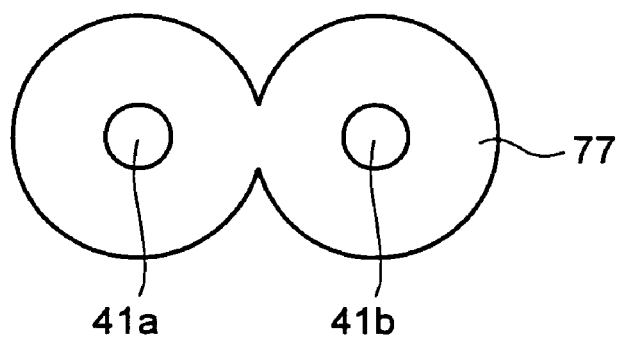
Figure 19C:
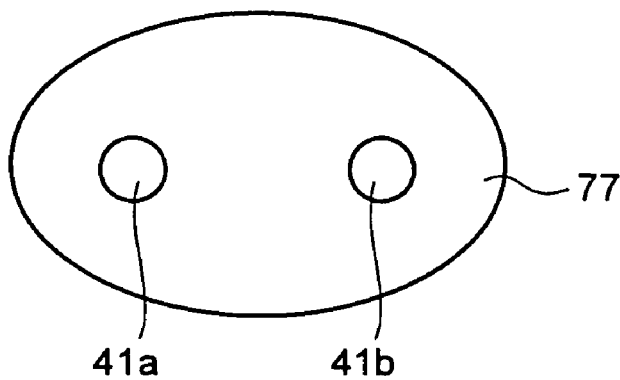

As can be seen, by using the differential lines for the feed-throughs, the characteristic impedance varies less because of the electric field coupling between the high frequency signal pins 41a and 41b. Therefore, it is possible to appropriately allow the variation of the positions of the pins at the step of fixing the high frequency signal pins 41a and 41b by molding glass and that of the hole diameter when working the stem, to stabilize the quality, and to obtain inexpensive feed-throughs. Further, since the radius of the dielectric 610 can be set at 0.8 millimeter, and the dielectric is formed into an oval shape, an elliptic shape, or a cocoon shape (an example of dielectric shape is shown in FIGS. 19A to 19C), it is possible to obtain the can package smaller in size than the package in which the signal-phase feed-throughs are aligned.

Moreover, in the portion which protrudes into the can package 1 (on the micro-strip differential line substrate 46 side) and which connect an output end of the feed-through to the micro-strip differential line substrate 46, and the portion which protrudes toward the outside of the can package 1 (on the grounded coplanar differential line substrate 70 side) and which connects the output end of the feed-through to the micro-strip differential line substrate 46, the electric field coupling between the lines is appropriately maintained and the change of the characteristic impedance can be suppressed. This can facilitate designing the matching circuits such as the stubs 54a and 54b.

Figure 10C:
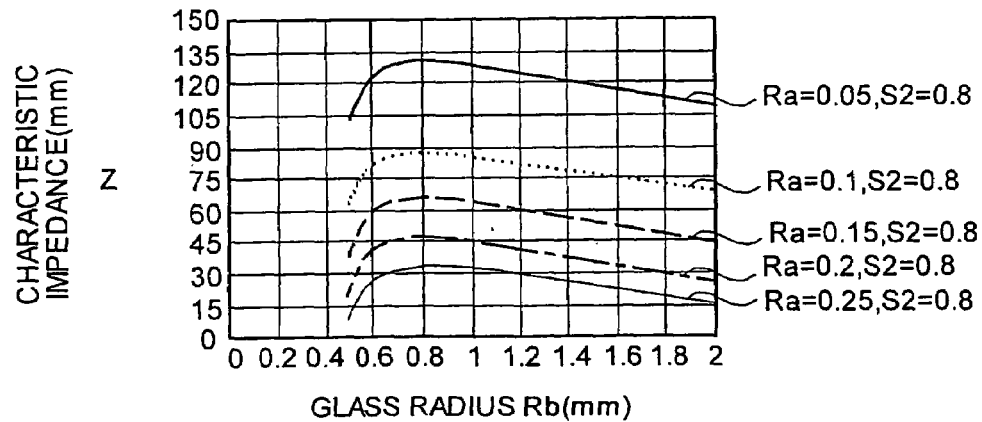
Figure 11:
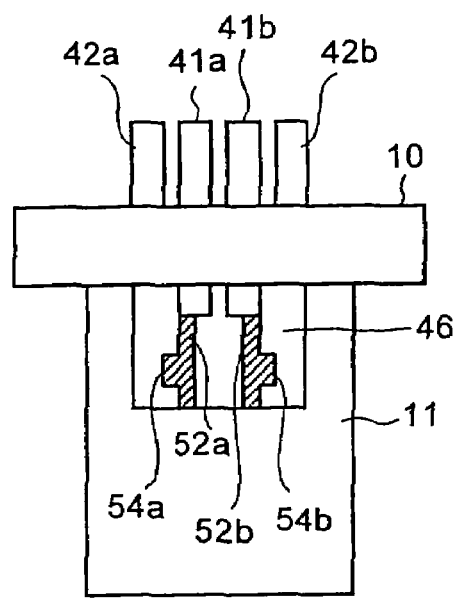
FIG. 11 illustrates a modification of arrangement of stubs.

FIG. 10C illustrates the characteristic impedance if the radius Ra of each of the high frequency signal pins 41a and 41b is in a range of 0.05 millimeter to 0.25 millimeter (0.05 millimeter, 0.1 millimeter, 0.15 millimeter, 0.20 millimeter, and 0.25 millimeter), and the central distance S2 between the pins is 0.8 millimeter. By changing the radius Ra of each pin, the characteristic impedance can be set at a desired magnitude. As can be seen from FIG. 10C, even if the radius Ra of the pin is appropriately selected, the characteristic impedance less changes as the radius of the dielectric Rb changes and the same advantages can be exhibited.

Preferably, the central distance S2 between the high frequency signal pins 41a and 41b is 0.7 to 0.9 millimeter, and the radius Rb of the dielectric 610 is 0.65 to 1.1 millimeters. It is also preferable to set the radius of each of the high frequency signal pins 41a and 41b in a range of 0.05 millimeter to 0.25 millimeter.

In the first embodiment, an area from the outputs of the differential transistors 103 and 104 in the LD driving circuit 100 to the LD 40 is entirely constituted by differential lines so as to make impedance matching in the area, and the LD 40 is driven. Even the pins that are penetrated through the stem 10 are formed as the differential pins that constitute the differential lines by penetrating the paired high frequency signal pins 41a and 41b through the oval dielectric 77. Therefore, the electrical coupling between the both signal pins increases, so that the electric field can be constrained and loss caused by leakage can be reduced. Accordingly, discontinuity of the electric field in the portion of the stem 10, on which the high frequency signal pins 41a and 41b are arranged, in which portion a dimensional variation particularly tends to occur and which is exposed to the LD driving circuit 110 side (hereinafter, "driver-side pin exposed region") can be suppressed as compared with the conventional art. Furthermore, since the ground pins 42a and 42b are arranged in parallel to the high frequency signal pins 41a and 41b in the driver-side pin exposed region, it is possible to suppress impedances of the portions and suppress reflection in the portions.

For example, the single-phase driving type optical semiconductor package, since a high current that drives the LD is fed back to the driving circuit via the ground, the ground potential changes. This potential change often adversely affects optical reception electronic circuits, arranged proximate to the package, for detecting the feeble current. In this embodiment, the LD is push-pull operated using the differential lines. Therefore, the optical semiconductor package in the first embodiment has advantages in that the high current is carried across the differential lines, the ground potential has less change, and the peripheral circuits are less affected.

Since the driver-side pin exposed region has the differential line configuration, and the ground pins 42a and 42b are arranged outside of the region, the impedance of this region is set low and the impedance difference between this region and the inside of the stem can be, thereby, set small as compared with the conventional art. In addition, since the discontinuity of the electric field is reduced, the passing characteristics and the reflection characteristics can be improved.

As the dielectric 77 arranged around the high frequency signal pins 41a and 41b, the glass is used. Therefore in the inner portion of the stem 10 (the feed-through portion in which the high frequency signal pins 41a and 41b are surrounded by the dielectric 77, hereinafter, also referred to as "pin unexposed region"), the impedance of the inner portion tends to be extremely lowered. To increase the impedance of this pin unexposed region, a cross-sectional area of the dielectric 77 arranged around the high frequency signal pins (an area of the oval) may be set large. If so, however, the optical semiconductor package cannot satisfy requirements for microfabrication and space saving.

Therefore, the protruding lengths of the two high frequency signal pins 41a and 41b toward the LD 40 side are set small so that they can be promptly transferred to the differential signal lines 52a and 52b on the micro-strip differential line substrate 46 when the signals are out of the dielectric 77. In addition, the distance between the strip differential signal lines 52a and 52b on the micro-strip differential line substrate 46 in the portions which are connected to the high frequency signal pins 41a and 41b, respectively and which are closer to the stem 10 (see FIG. 6) are set larger than the distance therebetween in, for example, the portions closer to the differential line substrate 47, or set slightly larger than the distance between the high frequency signal pins 41a and 41b, By thus setting the distance relatively large, the electrical coupling in the portions is made low and the portions are set to have higher impedances. For example, the impedances of the feed-through portions of the high frequency signal pins 41a and 41b are set at 60 ohms, those of the portions 52d in which the distance between the strip differential signal lines 52a and 52b is large, are set at 150 ohms, those of the portions of the strip differential signal lines 52a and 52b in which the distance between the lines 52a and 52b is small and which is closer to the differential line substrate 47 are set at 100 ohms.

As can be seen, the distance between the differential lines in the differential line portions right after the lines are out of the stem is set large to thereby purposely create the high impedance portion. The impedance is cancelled by this high impedance portion and the low impedance portion inside the stem (in the pin unexposed region), whereby impedance matching is made as a whole. In other words, since the pin unexposed region (feed-through portion) is low in impedance, the impedance matching is made in the overall package by slightly generating a high impedance after the region.

In addition, the paired stubs 54a and 54b for impedance matching are formed halfway along the strip differential signal lines 52a and 52b, respectively. The impedance is reduced by the paired stubs 54a and 54b, thereby preventing occurrence of mismatching between the strip differential signal lines 52a and 52b and the strip differential lines 56a and 56b, respectively. In other words, by using the paired stubs 54a and 54b, the reactance components in the driver-side pin exposed region and those in the pin unexposed region (feed-through portion) are compensated for each other, and the passing characteristics and the reflection characteristics are thereby improved.

Further, the paired stubs 54a and 54b protrude not outward but inward (so as to be closer to each other signal line), which, therefore, contributes to microfabrication of the micro-strip differential line substrate 46 if it is unnecessary to make the micro-strip differential line substrate 46 small in size, the stubs 54a and 54b may protrude outward of the differential lines 52a and 52b.

The layout of the four substrates (the micro-strip differential line substrates 46 and 47, the LD chip carrier 48, and the bias circuit substrate 49) and that of the PD chip carrier 45 on the pedestal 11 will be explained.

In the can package 1, it is necessary to arrange the differential line substrate for connecting the high frequency signal pins 41a and 41b to the LD 40, the substrate on which the LD 40 is mounted, the bias circuit substrate for supplying DC bias currents to the LD 40, and the monitor PD.

Figure 12:
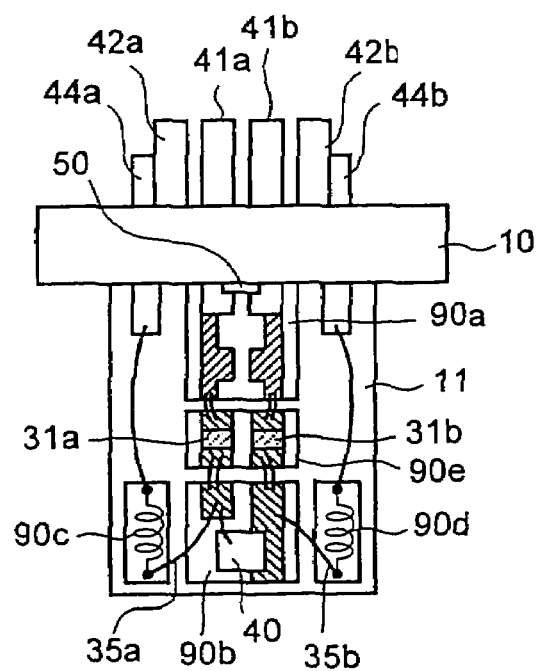
FIG. 12 illustrates most common layout of various constituent elements.

FIG. 12 illustrates the layout on the other pedestal 11 if the differential line configuration is provided. The high frequency signal pins 41a and 41b are arranged at the center of the stem 10 to be penetrated through the stem 10, and the ground pins 42a and 42b are arranged to put the high frequency signal pins 41a and 41b therebetween. In addition, the bias feed pins 44a and 44b are arranged to be penetrated through the stem 10 so as to put the high frequency signal pins 41a and 41b, and the ground pins 42a and 42b therebetween. In a central portion of the pedestal 11, a differential line substrate 90a that connects the high frequency signal pins 41a and 41b to the LD 40, a substrate 90b on which the LD 40 is mounted, and a substrate 90e on which the matching resistors 31a and 31b are mounted are arranged. Further, bias circuit substrate 90c and 90d each having a solenoid are arranged on the pedestal 11 both sides of the LD 40, respectively, the solenoids provided on the bias substrates 90c and 90d are connected to the bias feed pins 44a and 44b through wire bonds, respectively.

With such a layout, since a laser light is emitted only before and after the LD 40, it is necessary to provide the monitor PD vertically to the high frequency signal pins 41a and 41b, It is, therefore, difficult to arrange the monitor PD 50 because of space restriction. Further, the differential line substrate 90a, the substrate on which the LD 40 is mounted, and the substrate 90e on which the matching resistors 31a and 31b are mounted are arranged linearly in a laser light emission direction. Therefore, a length of the pedestal 11 along the laser light emission direction is larger, thereby making the package large in size. Furthermore, in order to decrease the inductances of the wire bonds 35a and 35b connecting to the bias circuits, the substrate should be divided in half, thereby pushing up cost. Besides, the transparent dielectric 77 for sealing and fixing the high frequency signal pins 41a and 41b is located right in rear of the LD 40. As a result, a monitor light from the LD 40 is directly emitted to the outside of the can package 1 through the transparent dielectric 77. Therefore, there is a probability that the monitor light enters operator's eyes if the operator performs an operation while driving the LD 40.

Under these circumstances, in the first embodiment shown in FIG. 5 to FIG. 7, the micro-strip differential line substrates 46 and 47 and the bias circuit substrate 49 are arranged on both sides of the LD chip carrier 48, respectively so as to put the LD chip carrier 48 therebetween. In other words, the strip differential signal lines 52a, 52b, 56a, and 56b on the micro-strip differential line substrates 46 and 47, the wiring patterns 62a and 62b including a pair of inductance circuits, and the LD 40 are arranged generally in a U-shaped fashion with the LD 40 put at the center.

Due to this configuration, the length of the pedestal 11 in the laser light axis direction may be equal to the length for the micro-strip differential line substrates 46 and 47. As compared with the layout shown in FIG. 12, the optical semiconductor package can be made small in size.

Furthermore, the micro-strip differential line substrates 46 and 47 are arranged at the positions shifted sideways from the LD chip carrier 48. Naturally, therefore, the transparent dielectric 77 for sealing and fixing the high frequency signal pins 41*a* and 41*b* is provided at the position shifted sideways from the LD chip carrier 48. The intensity of the laser light is lower as the laser light is more shifted from the light axis in a Gauss distribution. As a result, only the light low in intensity is incident on the transparent dielectric 77, thereby making it possible to improve safety during operation.

There is a technique for constituting the substrate on which the LD 40 is mounted and the differential line substrates connecting the high frequency signal pins 41*a* and 41*b* to the LD 40 out of the same substrate. With this technique, however, a substrate material, such as an aluminum nitride substrate (AlN), expensive per unit area and having good radiation characteristics needs to be used in a wide area so as to radiate the heat from the LD 40 that serves as a heat source. This causes a cost hike.

To avoid such a cost hike, the LD chip carrier 48 on which the LD 40 serving as the heat source is mounted is separated from the other substrates and provided as an independent substrate as shown in FIG. 5 and FIG. 6. Accordingly, it suffices to use the ceramic substrate material, such as the aluminum nitride substrate (AlN), which is expensive and which has good radiation characteristics only for the LD chip carrier 48 and to use the ceramic substrate material, such as inexpensive $Al_2O_3$ for the other substrates (the micro-strip differential line substrates 46 and 47, and the bias circuit substrate 49). Thus, cost reduction can be realized.

Moreover, with the layout in the first embodiment, the micro-strip differential line substrate 46 for impedance matching and the micro-strip differential line substrate 47 for arranging the matching resistors 31*a* and 31*b* are provided as separate substrates. Therefore, it is possible to cut out the ceramic substrates economically, thereby contributing to cost reduction. Additionally, the micro-strip differential line substrate 46 for impedance matching is manufactured simultaneously with the stem 10, a unit in which the stem 10 and the micro-strip differential line substrate 46 are connected and fixed to each other by brazing or soldering is formed, and the unit is assembled with the other constituent elements. Thus, it is possible to perform manufacturing operation with a high degree of freedom, and to thereby improve operativity. As a diameter of the stem 10, a diameter of, for example 5.6 millimeters can be sufficiently realized.

Furthermore, the parallel circuit of the air-cored solenoid 33*a* and the resonance prevention resistor 34*a* and the parallel circuit of the air-cored solenoid 33*b* and the resonance prevention resistor 34*a*, which circuits are connected to the bias feed pins 44*a* and 44*b*, respectively, are arranged on the same bias circuit substrate 49, thereby making the bias circuit substrate small in area. This contributes to cost reduction and microfabrication.

Since the air-cored solenoids 33*a* and 33*b* on the bias circuit substrate 49 are arranged to cross each other, preferably to be orthogonal to each other so that magnetic fields of the solenoids 33*a* and 33*b* do not interfere with each other. Therefore, the magnetic field generated in one of the solenoids does not influence the other solenoid, and the positions at which the air-cored solenoids 33*a* and 33*b* area arranged can be made closer to the anode and cathode of the LD 40.

The arrangement of the PD 50 will next be explained. The PD chip carrier 45 on which the PD 50 is mounted is not arranged right in rear of the LD 40 but at a position slightly shifted vertically and horizontally relative to the laser light axis. It is thereby possible to make effective use of the space, and to realize the layout of the bias feed pins 44*a* and 44*b*, the monitor signal pin 43, and the like on the stem 10 with a high degree of freedom.

Figure 13:
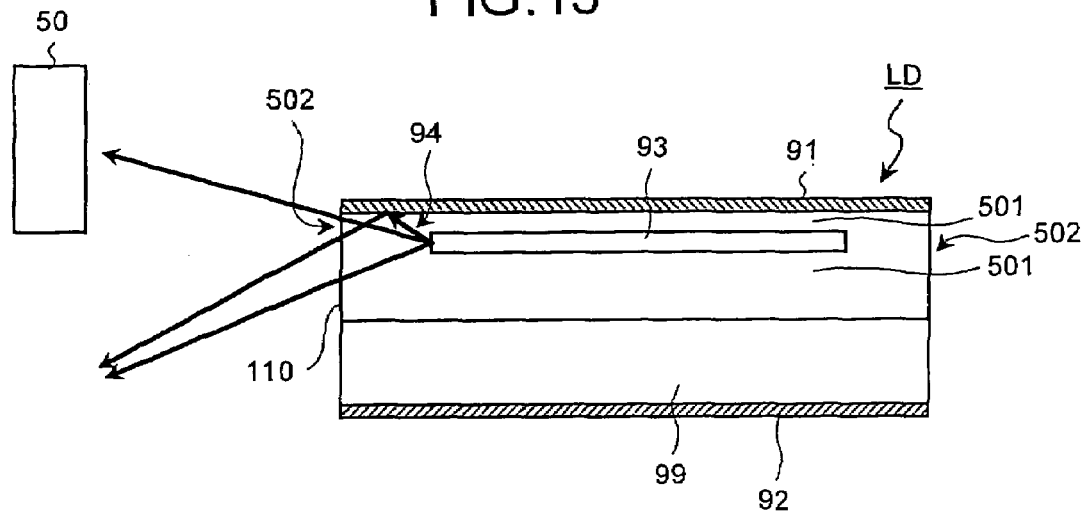
FIG. 13 is an illustration for explaining conditions for arranging an LD and a PD.

Furthermore, to select a direction in which the PD 50 is shifted, whether to shift the PD 50 upward or downward of the LD 40 depends on the positional relationship between a semiconductor substrate 99 and an active layer 93 that constitutes the LD 40, and on an intensity distribution of a far-field pattern of the monitor light. FIG. 13 schematically illustrates the structure of the LD 40.

The LD 40 includes a cathode (an n electrode) 91, an anode (a p electrode) 92, the p-type semiconductor substrate 99, the active layer 93 that serves as a light emission region, a window structure 94 for reducing a reflected return light from an end face 110 coated with a antireflection film (an AR coat), cladding layers 501 between which the active layer 93 is put, and the like. The window structure 94 is a structure having the following effects. Impurities are injected or diffused into neighborhoods of a resonator end face (cleavage plane) 502 to disorder the active layer, thereby increasing a bandgap in the neighborhoods of the end face, suppressing optical absorption in the neighborhoods of the end face, and preventing the breakage of the end face.

Since the active layer 93 is disposed to be offset to a direction opposite to a direction of the semiconductor substrate 99, the emitted laser light has the following intensity distribution.

Part of the laser light emitted from the active layer 93 is reflected by the cathode 91 deposited above the window structure 94 and consisting of high reflectivity metal. This reflected light interferes with the other laser light emitted directly from the active layer 93 through the window structure 94. As a result, the intensity distribution of the monitor light at a position away from the PD 50 by a distance substantially equal to a distance by which the PD 50 is disposed to be away from the monitor light is that show in FIG. 14. In the intensity distribution shown in FIG. 14, in a positive angle region (semiconductor substrate 99 side), a ripple caused by the interference occurs. Therefore, if the PD 50 is arranged on a side on which such a ripple occurs, a light reception sensitivity is suddenly changed by a slight assembly error or the like. As a result, the monitor light cannot be detected with high accuracy.

Figure 14:
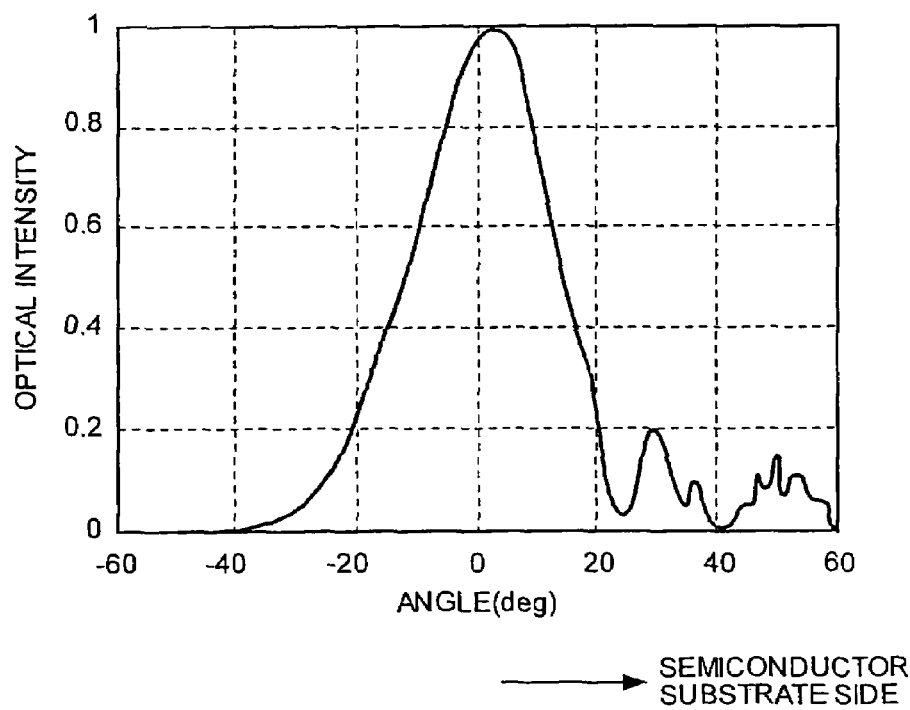
FIG. 14 illustrates an optical intensity distribution of a light emitted from the LD.

On the other hand, as shown in FIG. 14, in a negative angle region (opposite side to the semiconductor substrate 99 side), a form similar to an ordinary Gauss distribution waveform that smoothly changes up to a position at which the light is reflected by the anode 91 is obtained.

Accordingly, if the PD 50 is arranged to be offset to the direction opposite to the direction of the semiconductor substrate 99 relative to the light axis, it is possible to avoid the influence of the ripple of the far-field pattern caused by the interference, and to detect the monitor light with high accuracy.

Figure 15:
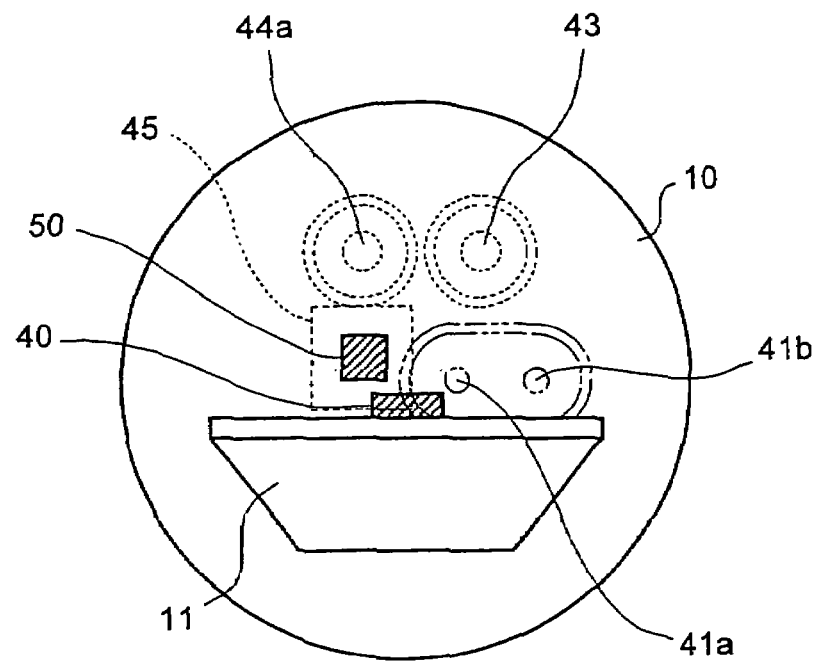
FIG. 15 is an illustration for explaining a state of arranging the LD and the PD.

FIG. 15 illustrates the positional relationship between the LD 40 and the PD 50 in the can package 1 in the first embodiment shown in FIG. 5 to FIG. 7. As shown in FIG. 15, the PD 50 is arranged upward of the LD 40, i.e., arranged to be offset to the opposite direction to the direction of the semiconductor substrate relative to the light axis. By so arranging, the influence of the ripple of the far-field pattern caused by the interference can be avoided, and the monitor light can be detected with high accuracy. The PD 50 is arranged also shifted from the LD 40 horizontally. A lower surface of the PD chip carrier 45 is slightly away from an upper surface of the pedestal 11.

Figure 16:
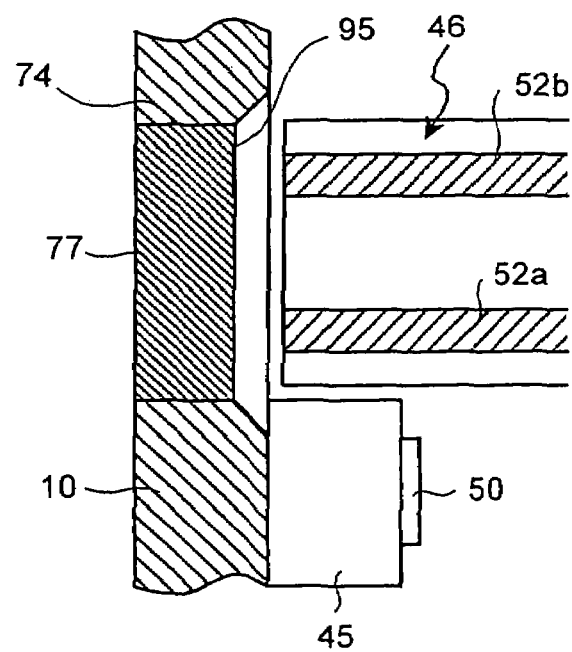
FIG. 16 is an enlarged view in the neighborhoods of an oval dielectric disposed at the stem.

Referring next to FIG. 16, a thickness of the oval dielectric (glass 77) to be inserted into the stem 10 will be explained. If the thickness of the dielectric 77 is set equal to a depth of the hole 74 formed in the stem 10, i.e., a width of the stem 10, then edges of the glass project when the glass is heated in the electric furnace and irregularities are formed on a wall surface of the stem 10. The irregularities on the wall surface of the stem 10 are an obstruction when the various components are arranged.

Therefore, the thickness of the dielectric 77 is set smaller than the depth of the hole 74 formed in the stem 10, i.e., the width of the stem 10. Before heating the dielectric 77 in the electric furnace, a hole 95 having an LD-side opening portion formed into a cone shape is formed in the stem 10 as shown in FIG. 16. By forming the hole 95, even if the edges of the glass project when being heated in the electric furnace, the glass does not reach the wall surface of the stem 10 and arbitrary components can be arranged to be overlapped with the region of this dielectric 77. In the first embodiment shown in FIG. 5 to FIG. 7, the PD chip carrier 45 for arranging the PD 50 thereon is arranged to be overlapped with the dielectric 77 as shown in FIG. 16. In addition, as shown in FIG. 5, FIG. 15, and the like, an abutment surface of the pedestal 11 on which the pedestal 11 abuts on the stem 10 is arranged to be overlapped with the conical opening portion of the hole 95. Likewise, the dielectrics 79a, 79b, and 78 for sealing and fixing the other pins such as the bias feed pins 44a and 44b and the monitor pin 43 are set to have smaller thicknesses than the width of the stem 10. In this example, the hole 95 is formed on the wall surface of the stem 10 onto which the pedestal 11 is fixed. If components are arranged on the opposite surface of the stem 10, a similar hole may be formed on the opposite wall surface of the stem 10.

Figure 17:
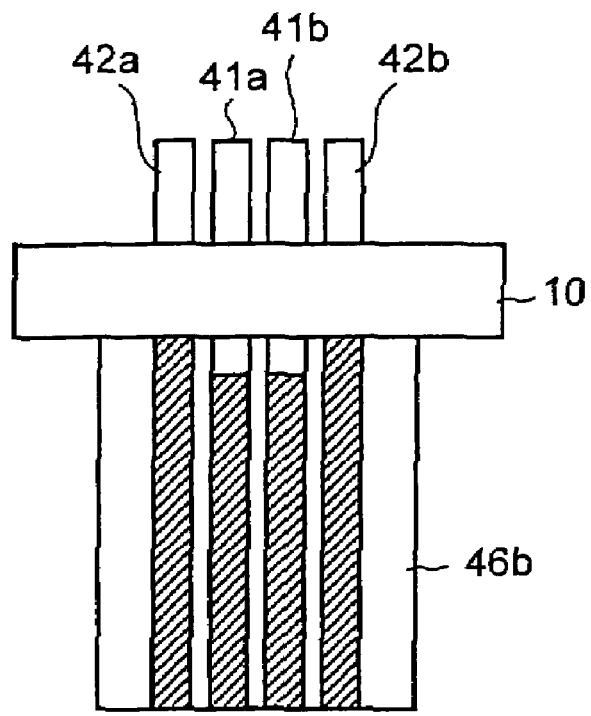
FIG. 17 illustrates a modification of the first embodiment and illustrates a grounded coplanar differential line.

In the first embodiment, a grounded coplanar differential line 46b as shown in FIG. 17 may be employed in place of the micro-strip differential substrates 46 and 47. As already explained, the grounded coplanar differential line 46b includes a pair of differential signal lines formed on the substrate, grounds arranged outside of the differential signal lines so as to put the paired differential signal lines therebetween, and a solid ground arranged on the rear surface of the substrate.

Figure 18:
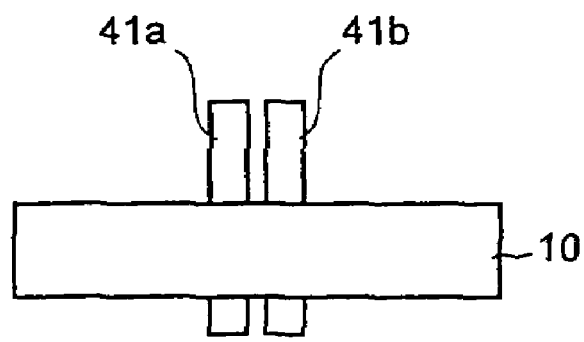
FIG. 18 illustrates a modification of the first embodiment.

In the first embodiment, the ground pins 42a and 42b are provided outside of the high frequency signal pins 41a and 41b. Alternatively, the ground pins 42a and 42b can be omitted as shown in FIG. 18.

Second Embodiment

The second embodiment of the present invention will be explained with reference to FIGS. 19A to 19C. FIG. 19A to FIG. 19B illustrate the other shapes of the dielectric 77 for sealing the high frequency signal pins 41a and 41b.

In FIG. 19A, the cocoon shape in which two circles are connected to each other by a straight line (or a gentle curve) is adopted as the shape of the dielectric. If attention is paid to distances from one pin 41a (or 41b) to peripheral edges of the dielectric 77, that is, to the stem 10 serving as a ground member, then distances of a part around about 270 degrees at the center of the pin 41a (or 41b) are equal, i.e., r, and the distances of the remaining parts from the pin 41a (or 41b) are larger than the distance r. If the dielectric is oval as employed in the first embodiment, then distances of a part around about 180 degrees at the center of the pin 41a (or 41b) are equal, i.e., r, and the distances of the remaining parts from the pin 41a (or 41b) are larger than the distance r. If the cocoon-shaped dielectric and the oval dielectric equal in area are compared, the impedance of the oval dielectric can be set higher than that of the cocoon-shaped dielectric. As explained above, in the pin unexposed region (feed-through region), the impedance tends to be extremely lowered. The oval dielectric is advantageous over the cocoon-shaped dielectric with a view of increasing the impedance. Needless to say, if the cocoon-shaped dielectric is employed, the area of the dielectric may be adjusted so as to be able to obtain the impedance substantially equal to that of the oval dielectric.

In FIG. 19B, the shape in which two circles are directly coupled is adopted as the shape of the dielectric 77. In FIG. 19C, an elliptic shape is adopted.

Third Embodiment

The third embodiment of the present invention will be explained with reference to FIG. 20. In the third embodiment, the stem 10 is constituted to have a multi-structure so as to reduce the cost of the stem 10.

Figure 20:
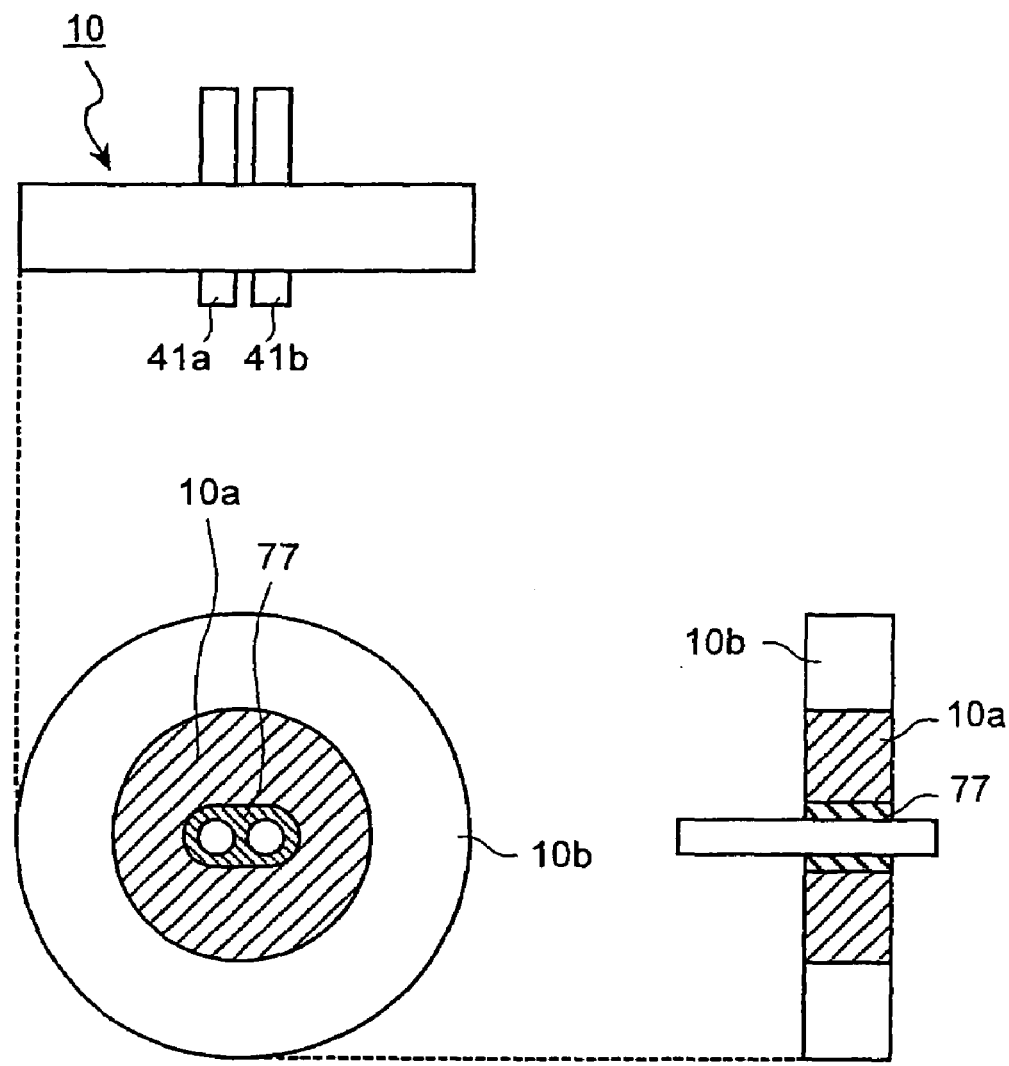
FIG. 20 is an illustration for explaining a third embodiment of the present invention, and illustrates a multi-structure stem with dielectric.

In the stem 10 in the third embodiment shown in FIG. 20, the high frequency signal pins 41a and 41b are arranged substantially in the central portion of the stem 10, and the oval dielectric 77 consisting of soda-barium glass is arranged around the high frequency signal pins 41a and 41b each consisting of Kovar. A first stem member 10a substantially equal in coefficient of thermal expansion to the dielectric 77 and consisting of Kovar is arranged so as to prevent cracks from occurring to the dielectric 77. A second stem member 10b consisting of an inexpensive material, such as iron, having a relatively good thermal conduction is arranged outside of the first stem member 10a. By arranging the members 10a and 10a, the radiation characteristics are improved. As a material for the second stem member 10a, copper-tungsten or the like other than iron can be used. The first stem member 10a is coupled to the second stem member 10b by brazing.

Fourth Embodiment

The fourth embodiment of the present invention will be explained with reference to FIGS. 21A and 21B. The fourth embodiment is intended to further improve the radiation characteristics of the can package 1. This fourth embodiment is, therefore, suited if a package in which the pedestal 11 and the stem 10 are formed out of Kovar or the like integrally and which has inferior radiation characteristics is employed.

Figure 21A:
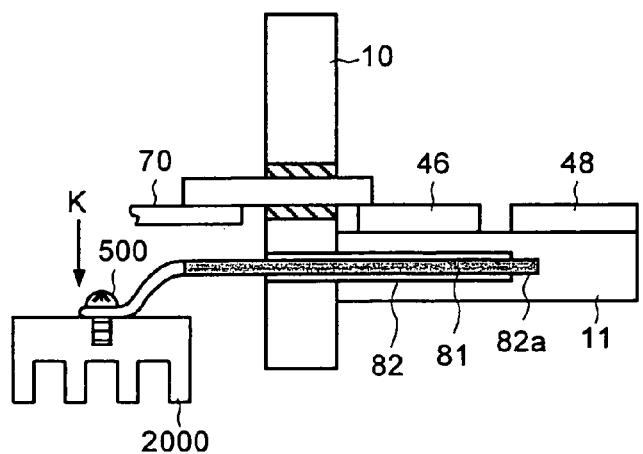
FIGS. 21A and 21B are illustrations for explaining a fourth embodiment of the present invention.

As shown in FIG. 21A, a wire insertion hole 82 for inserting a wire (heat pipe) 81 consisting of Cu having good thermal conduction is formed in the pedestal 11 and the stem 10. A diameter of the wire insertion hole 82 is set larger than a diameter of the wire 81. On a bottom of the wire insertion hole 82, a press-fit hole 82a is formed. One end of the wire 81 is press-fitted and fixed into this press-fit hole 82a. A length of the press-fit hole 82a is set as small as possible in a range in which the wire 81 can be fixed. This is intended to prevent occurrence of a distortion due to the difference in coefficient of thermal expansion between the wire 81 and the pedestal 11. If the radiation of the heat from the LD 40 is considered, the press-fit hole 82a for fixing one end of the wire 81 is preferably arranged right under the LD 40 or the LD chip carrier 48.

In the portion in which the wire 81 reaches the bottom of the hole 82, it is preferable that the wire 81 is out of contact with an inner peripheral surface of the wire insertion hole 82. However, if the friction between the wire 81 and the wire insertion hole 82 or the interference between the surfaces can prevent occurrence of the distortion due to the difference in coefficient of thermal expansion between the wire 81 and the pedestal 11, the wire 81 may be slightly in contact with the inner peripheral surface of the wire insertion hole 82. Nevertheless, it is necessary to prevent the wire (heat pipe) 81 from being coupled with the inner peripheral surface of the wire insertion hole 82 by soldering or the like.

Figure 21B:
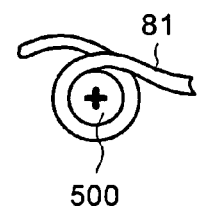

As shown in FIG. 21B which is a view if FIG. 21A is viewed from a K direction, the other end of the wire 81 is bent into a spiral shape. A screw 500 is inserted into a spiral center of the other end of the wire 81 bent into a spiral shape, and the other end thereof is mated with a screw hole located on a rear surface side of the grounded coplanar differential line 70 and provided in a heat sink 2000. As a result, the other end of the wire 81 is fixed to the heat sink 2000. At this moment, the other end of the wire 81 is fixed thereto while having spring properties. Therefore, even if the difference in thermal displacement between the wire 81 and the pedestal is generated due to the difference in the coefficient of thermal expansion therebetween, the thermal displacement can be absorbed and the occurrence of the distortion of the pedestal 11 can be prevented. An external substrate electrically connected to the can package 1 and the LD module 3 are contained in a case which is not shown. The heat sink 2000 is provided on a wall surface of this case.

A heat generated from the LD 40 is radiated from the LD chip carrier 48 to one end of the wire 81 through the pedestal 11. The heat thus conducted to the wire 81 is conducted from the other end of the wire 81 to the heat sink 2000, and radiated to the open air from a fin provided in the heat sink 2000.

Thus, in the fourth embodiment, the wire 81 for radiation is provided in the pedestal 11 and the stem 10 so that the wire 81 is out of contact with the wall surface. Therefore, heat generated from heat sources such as the LD 40, a driver IC, and a trans-impedance amplifier can be efficiently radiated, and the occurrence of the distortion due to the difference in coefficient of thermal expansion between the wire 81 and the pedestal 11 can be prevented.

Fifth Embodiment

Figure 22:
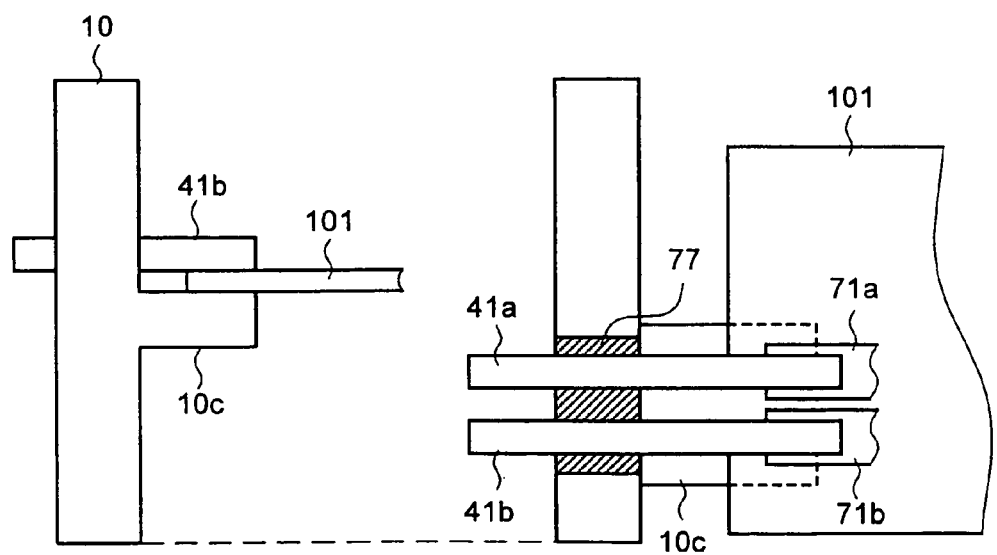
FIG. 22 is an illustration for explaining a fifth embodiment of the present invention.

The fifth embodiment of the present invention will be explained with reference to FIG. 22. In the fifth embodiment, differently from the preceding embodiments, the ground pins 42a and 42b are not arranged on the both sides of the high frequency signal pins 41a and 41b, respectively so as to put the pins 41a and 41b therebetween, but a protruding portion 10c is provided on the stem 10 serving as the ground member in parallel to the high frequency signal pins 41a and 41b, and this protruding portion 10c is allowed to function equally to the ground pins 42a and 42b. The protruding portion 10c is arranged so that the high frequency signal pins 41a and 41b and the protruding portion 10c vertically put an external substrate 101 therebetween. Therefore, the protruding portion 10c is also in contact with a solid ground formed on the rear surface of the external substrate 101. The protruding portion 10c consists of the same material as that for the stem 10, is plated with metal similarly to the stem 10, and constitutes a ground surface.

Sixth Embodiment

The sixth embodiment of the present invention will be explained with reference to FIG. 23. In the sixth embodiment, the present invention is applied to a box-like optical semiconductor package 200, in which various constituent elements including the LD 40 and mounted on the can package 1 in the preceding embodiments, and the LD driving circuit 100 shown in FIG. 4 are mounted.

As shown in FIG. 23(a), in this optical semiconductor package 200, positive-phase and antiphase differential signals are input to the input buffer 102 of the LD driving circuit 100 similarly to the preceding embodiments. Therefore, in order to input the differential signals to the LD driving circuit 100 in the optical semiconductor package 200, the configuration including the dielectric 77 of an oval shape or the like, the paired high frequency signal pins 41a and 41b sealed into the dielectric 77, and the paired ground pins 42a and 42b arranged outside of the high frequency signal pins 41a and 41b is mounted on part of a wall surface of the optical semiconductor package 200. One end of each of the high frequency signal pins 41a and 41b is connected to a differential strip line 201 and transmitted to the input buffer 102 in the LD driving circuit 100 through this differential strip line 201 similarly to the preceding embodiments.

In this sixth embodiment, the differential signals are input to the LD driving circuit 100 using the differential signal pins. Similarly to the preceding embodiments, it is possible to suppress the deterioration of the high frequency characteristics of the package, and to improve the airtightness thereof.

As shown in FIG. 23(a), feed-throughs for transmitting signals between inside and outside of the package using a ceramic substrate 100a may be used for signal pins (leads) 1001 other than the high frequency signal pins 41a and 41b that transmit bias currents or control signals for the LD driving circuit 100. If so, the signal pins 1001 are flat.

Needless to say, as shown in FIG. 23(b), through holes may be formed in the wall surface of the optical semiconductor package 200 so that cylindrical signal pins 1002 inserted into the respective through holes are fixed to the sidewall of the optical semiconductor package 200 through a dielectric 1003 consisting of such a material as glass in an airtight state. If so, a ceramic substrate 1001b is not employed. Therefore, as compared with the optical semiconductor package shown in FIG. 23(a), a package structure which can be manufactured as a low cost can be provided.

In the embodiments, the stem configuration for inputting the differential signals is applied to the LD module on which the LD 40 is mounted. The stem configuration may be applied to an EA module in which a field absorption optical modulator (EA modulator or Electro-absorption Modulator) is mounted or a PD module on which a light reception element is mounted and which receives an optical signal. Needless to say, a Peltier element for adjusting a temperature of the LD may be employed.

As explained so far, according to the present invention, the optical semiconductor package including the stem that includes holes, the dielectric that is sealed into the holes of the stem and that includes a pair of pin insertion holes, and a pair of high frequency signal pins that are penetrated through and fixed to a pair of pin insertion holes in the dielectric and that constitute the differential lines connected to the optical semiconductor element is constituted. It is, therefore, possible to provide the optical semiconductor package which can keep low cost, which has good high frequency transmission characteristics, and which can operate at high speeds of 10 gigabits per second or more.

INDUSTRIAL APPLICABILITY

As explained so far, the optical semiconductor package according to the present invention is effectively applied to a coaxial module to which an optical fiber is attached, an optical semiconductor element module to which a receptacle type adaptor is attached for connecting the optical fiber, or the like. The optical semiconductor package according to the present invention is also effectively applied to an optical semiconductor element module applied to the local area network such as a network for the connection between the servers disposed in a building or a network for the connection between the servers disposed in different buildings.

The invention claimed is:

1. An optical semiconductor package that contains an optical semiconductor element and an integrated circuit, the optical semiconductor package comprising:
   a dielectric sealed into and fixed to a wall surface of the package, and having a pair of pin insertion holes; and
   a pair of signal pins that penetrate through and fit into the pair of pin insertion holes, and constituting differential lines, wherein
   differential signals are transmitted and received to and from the integrated circuit through the pair of signal pins, wherein
   the pair of signal pins are coupled by an electric field coupling each other, one of the signal pins extracts a positive-phase current signal and the other signal pin applies a current signal opposite in phase to the positive-phase current signal.

2. The optical semiconductor package according to claim 1, wherein the dielectric is glass.

3. The optical semiconductor package according to claim 1, wherein the wall surface of the package includes:
   a first member arranged on an outside of the dielectric, wherein a coefficient of thermal expansion of the first member is equal to a coefficient of thermal expansion of the dielectric; and
   a second member arranged on an outside of the first member, wherein a thermal conduction of the second member is higher than that of the first member.

4. The optical semiconductor package according to claim 1, wherein the dielectric is transparent or semitransparent.

5. The optical semiconductor package according to claim 1, wherein the hole in the wall surface of the package has one of an oval shape, an elliptic shape, and a cocoon shape.

6. The optical semiconductor package according to claim 1, wherein a ground member in parallel to the pair of high frequency signal pins is provided on the wall surface of the package.

7. The optical semiconductor package according to claim 6, wherein the ground member is a pair of ground pins, and the pair of ground pins are provided on outer sides of the pair of high frequency signal pins, respectively, so as to put the pair of high frequency signal pins between the pair of ground pins.

8. The optical semiconductor package according to claim 1, wherein the optical semiconductor element is a semiconductor laser diode including a pair of electrodes, and the optical semiconductor package further comprising:
   a differential line substrate having a one end side connected to the pair of high frequency signal pins, and an other end side connected to the pair of electrodes of the optical semiconductor element;
   a pair of inductance elements having one end sides connected to the pair of electrodes of the optical semiconductor element, respectively, and having other end sides connected to an external bias current source.

9. The optical semiconductor package according to claim 8, wherein stubs are formed on the pair of differential lines, respectively, and the pair of differential lines are formed on the differential line substrate.

10. The optical semiconductor package according to claim 9, wherein the stubs are formed to protrude in a direction in which the respective differential lines are closer to each other.

* * * * *